US011815551B1

(12) United States Patent
Fayneh et al.

(10) Patent No.: US 11,815,551 B1
(45) Date of Patent: Nov. 14, 2023

(54) DIE-TO-DIE CONNECTIVITY MONITORING USING A CLOCKED RECEIVER

(71) Applicant: PROTEANTECS LTD., Haifa (IL)

(72) Inventors: Eyal Fayneh, Givatayim (IL); Guy Redler, Haifa (IL); Evelyn Landman, Haifa (IL)

(73) Assignee: PROTEANTECS LTD., Haifa (IL)

( * ) Notice: Subject to any disclaimer, the term of this patent is extended or adjusted under 35 U.S.C. 154(b) by 0 days.

(21) Appl. No.: 18/089,541

(22) Filed: Dec. 27, 2022

Related U.S. Application Data

(60) Provisional application No. 63/349,863, filed on Jun. 7, 2022.

(51) Int. Cl.
*G01R 31/317* (2006.01)
*G01R 31/28* (2006.01)

(52) U.S. Cl.
CPC ... *G01R 31/31725* (2013.01); *G01R 31/2882* (2013.01)

(58) Field of Classification Search
None
See application file for complete search history.

(56) References Cited

U.S. PATENT DOCUMENTS

| | | |
|---|---|---|
| 4,555,663 A | 11/1985 | Shimizu |
| 5,548,539 A | 8/1996 | Vlach et al. |
| 5,748,509 A | 5/1998 | Fewster |
| 5,774,403 A | 6/1998 | Clark, II et al. |
| 5,818,251 A | 10/1998 | Intrater |
| 5,895,629 A | 4/1999 | Russell et al. |
| 5,956,497 A | 9/1999 | Ratzel et al. |

(Continued)

FOREIGN PATENT DOCUMENTS

| | | |
|---|---|---|
| CN | 101014991 A | 8/2007 |
| CN | 101344898 A | 1/2009 |

(Continued)

OTHER PUBLICATIONS

"Herres", "Test and Measurement Tips.Com"—(Aug. 2016) (Year: 2016).*

(Continued)

*Primary Examiner* — April Y Blair
*Assistant Examiner* — Matthew W Wahlin
(74) *Attorney, Agent, or Firm* — The Roy Gross Law Firm, LLC; Roy Gross

(57) ABSTRACT

An I/O sensor including: a programmable delay line; a delayed clocked receiver having the following inputs: (a) a data signal and a reference voltage that also serve as inputs to a reference clocked receiver that is configured to sample the data signal received from an interconnect lane between two integrated circuits (ICs) of a multi-IC module, and (b) a delayed clock signal received from the programmable delay line, wherein the delayed clock signal is a delayed version of a clock signal that clocks the reference clocked receiver; a comparison circuits configured to compare a data signal output of the delayed clocked receiver and a data signal output of the reference clocked receiver; and a controller configured, based on a comparison result of the comparison circuit and on the amount of delay that caused it, to estimate a quality of connectivity between the two ICs over the interconnect lane.

13 Claims, 15 Drawing Sheets

(56) References Cited

U.S. PATENT DOCUMENTS

| | | | |
|---|---|---|---|
| 5,966,527 A | 10/1999 | Krivokapic et al. |
| 6,182,253 B1 | 1/2001 | Lawrence et al. |
| 6,486,716 B1 | 11/2002 | Minami et al. |
| 6,586,921 B1 | 7/2003 | Sunter |
| 6,683,484 B1 | 1/2004 | Kueng et al. |
| 6,807,503 B2 | 10/2004 | Ye |
| 6,873,926 B1 | 3/2005 | Diab |
| 6,882,172 B1 | 4/2005 | Suzuki et al. |
| 6,948,388 B1 | 9/2005 | Clayton et al. |
| 7,038,483 B1 | 5/2006 | Suzuki et al. |
| 7,067,335 B2 | 6/2006 | Weiner et al. |
| 7,254,507 B2 | 8/2007 | Dosho et al. |
| 7,369,893 B2 | 5/2008 | Gunderson |
| 7,443,189 B2 | 10/2008 | Ramappa |
| 7,455,450 B2 | 11/2008 | Liu et al. |
| 7,501,832 B2 | 3/2009 | Spuhler et al. |
| 7,649,373 B2 | 1/2010 | Tokunaga |
| 7,701,246 B1 * | 4/2010 | Plants .................. H03L 7/0816 |
| | | 326/38 |
| 7,818,601 B2 | 10/2010 | LaBerge |
| 7,877,657 B1 | 1/2011 | Miller et al. |
| 8,001,512 B1 | 8/2011 | White |
| 8,086,978 B2 | 12/2011 | Zhang et al. |
| 8,279,976 B2 | 10/2012 | Lin et al. |
| 8,310,265 B2 | 11/2012 | Zjajo |
| 8,365,115 B2 | 1/2013 | Liu et al. |
| 8,418,103 B2 | 4/2013 | Wang et al. |
| 8,479,130 B1 | 7/2013 | Zhang et al. |
| 8,633,722 B1 | 1/2014 | Lai |
| 8,825,158 B2 | 9/2014 | Swerdlow |
| 9,424,952 B1 | 8/2016 | Seok et al. |
| 9,490,787 B1 | 11/2016 | Kho et al. |
| 9,536,038 B1 | 1/2017 | Quinton et al. |
| 9,564,883 B1 | 2/2017 | Quinton et al. |
| 9,564,884 B1 | 2/2017 | Quinton et al. |
| 9,632,126 B2 | 4/2017 | Yoon et al. |
| 9,714,966 B2 | 7/2017 | Chen et al. |
| 9,760,672 B1 | 9/2017 | Taneja et al. |
| 9,791,834 B1 | 10/2017 | Nassar et al. |
| 9,954,455 B2 | 4/2018 | Lin et al. |
| 9,991,879 B2 | 6/2018 | Huang |
| 10,490,547 B1 | 11/2019 | Ali et al. |
| 10,509,104 B1 | 12/2019 | Dato |
| 10,530,347 B2 | 1/2020 | Tang et al. |
| 11,081,193 B1 | 8/2021 | Tang |
| 11,409,323 B2 | 8/2022 | Herberholz et al. |
| 2004/0009616 A1 | 1/2004 | Huisman et al. |
| 2004/0015793 A1 | 1/2004 | Saxena et al. |
| 2004/0230385 A1 | 11/2004 | Bechhoefer et al. |
| 2004/0230396 A1 | 11/2004 | Ye et al. |
| 2005/0114056 A1 | 5/2005 | Patel et al. |
| 2005/0134350 A1 | 6/2005 | Huang et al. |
| 2005/0134394 A1 | 6/2005 | Liu |
| 2006/0049886 A1 | 3/2006 | Agostinelli et al. |
| 2006/0224374 A1 | 10/2006 | Kwon et al. |
| 2007/0110199 A1 * | 5/2007 | Momtaz ............ H04L 25/03057 |
| | | 375/350 |
| 2007/0182456 A1 | 8/2007 | Agarwal et al. |
| 2008/0074521 A1 | 3/2008 | Olsen |
| 2008/0144243 A1 | 6/2008 | Mariani et al. |
| 2008/0147355 A1 | 6/2008 | Fields et al. |
| 2008/0183409 A1 | 7/2008 | Roberts et al. |
| 2008/0186001 A1 | 8/2008 | Singh et al. |
| 2008/0186044 A1 | 8/2008 | Singh |
| 2008/0262769 A1 | 10/2008 | Kadosh et al. |
| 2009/0027077 A1 | 1/2009 | Vijayaraghavan et al. |
| 2009/0076753 A1 | 3/2009 | Vijayaraghavan et al. |
| 2009/0096495 A1 | 4/2009 | Keigo |
| 2009/0183043 A1 | 7/2009 | Niwa |
| 2009/0230947 A1 | 9/2009 | Sumita |
| 2009/0244998 A1 | 10/2009 | Kim |
| 2009/0273550 A1 | 11/2009 | Vieri et al. |
| 2009/0278576 A1 | 11/2009 | Chakravarty |
| 2009/0306953 A1 | 12/2009 | Liu et al. |
| 2010/0153896 A1 | 6/2010 | Sewall |
| 2010/0251046 A1 | 9/2010 | Mizuno et al. |
| 2010/0253382 A1 | 10/2010 | Wang |
| 2011/0093830 A1 | 4/2011 | Chen et al. |
| 2011/0102091 A1 | 5/2011 | Yeric |
| 2011/0109377 A1 | 5/2011 | Fujibe et al. |
| 2011/0187433 A1 | 8/2011 | Baumann et al. |
| 2011/0267096 A1 | 11/2011 | Chlipala et al. |
| 2011/0295403 A1 | 12/2011 | Higuchi et al. |
| 2011/0315986 A1 | 12/2011 | Kaneda et al. |
| 2012/0025846 A1 | 2/2012 | Minas et al. |
| 2012/0038388 A1 | 2/2012 | Tseng et al. |
| 2012/0074973 A1 | 3/2012 | Baldwin et al. |
| 2012/0163074 A1 | 6/2012 | Franca-Neto et al. |
| 2012/0187991 A1 | 7/2012 | Sathe et al. |
| 2012/0212246 A1 | 8/2012 | Benjamin et al. |
| 2012/0217976 A1 | 8/2012 | Clarkson |
| 2012/0242490 A1 | 9/2012 | Ramaswami |
| 2013/0226491 A1 | 8/2013 | Miguelanez, II et al. |
| 2013/0293270 A1 | 11/2013 | Lee et al. |
| 2013/0335875 A1 | 12/2013 | Baumann |
| 2014/0132293 A1 | 5/2014 | Abadir et al. |
| 2014/0184243 A1 | 7/2014 | Iyer et al. |
| 2014/0254734 A1 | 9/2014 | Abdelmoneum et al. |
| 2015/0061707 A1 | 3/2015 | Balasubramanian et al. |
| 2015/0077136 A1 | 3/2015 | Li |
| 2015/0121158 A1 | 4/2015 | Wang et al. |
| 2015/0199223 A1 | 7/2015 | Banerjee et al. |
| 2015/0332451 A1 | 11/2015 | Amzaleg et al. |
| 2015/0365049 A1 | 12/2015 | Ozawa et al. |
| 2016/0042784 A1 | 2/2016 | Rim et al. |
| 2016/0072511 A1 | 3/2016 | Maekawa |
| 2016/0087643 A1 | 3/2016 | Nozaki |
| 2016/0131708 A1 * | 5/2016 | Huang .............. G01R 31/31711 |
| | | 324/76.11 |
| 2016/0153840 A1 | 6/2016 | Huang et al. |
| 2016/0156176 A1 | 6/2016 | Kunz, Jr. et al. |
| 2016/0164503 A1 | 6/2016 | Kim et al. |
| 2016/0203036 A1 | 7/2016 | Mezic et al. |
| 2017/0038265 A1 | 2/2017 | Abdelmoneum et al. |
| 2017/0179173 A1 | 6/2017 | Mandai et al. |
| 2017/0199089 A1 | 7/2017 | Fritchman et al. |
| 2017/0199228 A1 | 7/2017 | Hsieh et al. |
| 2017/0214516 A1 | 7/2017 | Rivaud et al. |
| 2017/0329391 A1 | 11/2017 | Jaffari et al. |
| 2017/0344102 A1 | 11/2017 | Kolla et al. |
| 2017/0364818 A1 | 12/2017 | Wu et al. |
| 2018/0034549 A1 | 2/2018 | Kikuchi |
| 2018/0183413 A1 | 6/2018 | Wong et al. |
| 2018/0365974 A1 | 12/2018 | Haas et al. |
| 2019/0019096 A1 | 1/2019 | Yoshida |
| 2019/0117122 A1 | 4/2019 | Kurachi et al. |
| 2019/0305074 A1 | 10/2019 | Kande et al. |
| 2020/0028514 A1 | 1/2020 | Hanke et al. |
| 2020/0203333 A1 | 6/2020 | Chen et al. |
| 2023/0098071 A1 | 3/2023 | Chonnad et al. |

FOREIGN PATENT DOCUMENTS

| | | |
|---|---|---|
| CN | 108534866 A | 9/2018 |
| DE | 102012219971 B4 | 7/2016 |
| EP | 2006784 A1 | 12/2008 |
| EP | 2060924 A1 | 5/2009 |
| EP | 2413150 A1 | 2/2012 |
| JP | 2009021348 A | 7/2013 |
| TW | 201614256 A | 4/2016 |
| WO | 2005080099 A1 | 9/2005 |
| WO | 2019097516 A1 | 5/2019 |
| WO | 2019102467 A1 | 5/2019 |
| WO | 2019135247 A1 | 7/2019 |
| WO | 2019202595 A1 | 10/2019 |
| WO | 2019244154 A1 | 12/2019 |
| WO | 2020141516 A1 | 7/2020 |
| WO | 2020230130 A1 | 11/2020 |
| WO | 2021019539 A1 | 2/2021 |

(56) References Cited

FOREIGN PATENT DOCUMENTS

| | | |
|---|---|---|
| WO | 2021214562 A1 | 10/2021 |
| WO | 2022/009199 A1 | 1/2022 |

OTHER PUBLICATIONS

"Lin et al." "A 10-GB-s Eye-Opening Monitor Circuit for Receiver Equalizer Adaptations in 65-nm CMOS"—(IEEE)—(2018) (Year: 2018).*

Kan Takeuchi et al; "FEOL/BEOL wear-out estimator using stress-to-frequency conversion of voltage/temperature-sensitive ring oscillators for 28nm automotive MCUs"; IEEE, pp. 265-268, Oct. 20, 2016.

Kan Takeuchi et al; "Wear-out stress monitor utilising temperature and voltage sensitive ring oscillators" IET Circuits, Devices & Systems. vol. 12 No. 2, pp. 182-188, Jan. 15, 2018.

Kan Takeuchi et al; "Experimental Implementation of 8.9Kgate Stress Monitor in 28nm MCU along with Safety Software Library for IoT Device Maintenance"; IEEE International Reliability Physics Symposium (IRPS). Mar. 31, 2019.

Dan Ernst et al; "Razor: Circuit-Level Correction of Timing Errors for Low-Power Operation"; IEEE Computer Society. Nov. 30, 2004.

Dan Ernst et al; "Razor: A Low-Power Pipeline Based on Circuit-Level Timing Speculation"; Appears in the 36th Annual International Symposium on Microarchitecture (MICRO-36). Dec. 1, 2003.

James P. Hofmeister, et al, "Ball Grid Array (BGA) Solder Joint Intermittency Detection: SJ Bist™", IEEE Aerospace Conference Proceedings, Apr. 2008, paper #1148, Version 1.

Paulheim H, Meusel R. "A decomposition of the outlier detection problem into a set of supervised learning problems", Machine Learning, Sep. 2015, vol. 100 Issue 2, pp. 509-531.

Zhang L, Marron JS, Shen H, Zhu Z., "Singular value decomposition and its visualization", Journal of Computational and Graphical Statistics, Dec. 2007, vol. 6 Issue 4, pp. 833-854.

Shinkai, Ken-ichi et al. "Device-parameter estimation with on-chip variation sensors considering random variability."; In 16th Asia and South Pacific Design Automation Conference (ASP-DAC 2011), pp. 683-688. IEEE, Jan. 25, 2011.

Weiwei Shan et al. "An improved timing error prediction monitor for wide adaptive frequency scaling", IEICE Electronics Express, vol. 14, No. 21, pp. 1-6, Oct. 20, 2017.

Agilent Technologies; "Clock Jitter Analysis with femto-second resolution"; Jan. 1, 2008.

Yousuke Miyake et al; "Temperature and voltage estimation using ring oscillator-based monitor for field test"; IEEE 23rd Asian Test Symposium; pp. 156-161, Nov. 16, 2014.

Basab Datta at al; "Analysis of a Ring Oscillator Based on Chip Thermal Sensor in 65nm Technology"; Online at: https://web.archive.org/web/20140328234617/http://www-unix.ecs.umass.edu/~dkumar/lab4_658_report/lab4_report.htm; Sep. 5, 2018.

Tilman Wolf et al; "Collaborative Monitors for Embedded System Security". Jan. 1, 2006.

Sandeep Kumar Samal et al; "Machine Learning Based Variation Modeling and Optimization for 3D ICs"; J. Inf. Commun. Converg. Eng. 14(4): 258-267, Dec. 2016.

Yin-Nien Chen et al; "Impacts of Work Function Variation and Line-Edge Roughness on TFET and FinFET Devices and 32-Bit CLA Circuits"; J. Low Power Electron. Appl. 2015, 5, 101-115. May 21, 2015.

Yong Zhao et al; "A Genetic Algorithm Based Remaining Lifetime Prediction for a VLIW Processor Employing Path Delay and IDDX Testing"; IEEE; Apr. 12, 2016.

Vivek S Nandakumar et al, "Statistical static timing analysis flow for transistor level macros in a microprocessor"; 2010, 11th International Symposium on Quality Electronic Design (ISQED), pp. 163-170, Mar. 22, 2010.

Jing Li et al, "Variation Estimation and Compensation Technique in Scaled LTPS TFT Circuits for Low-Power Low-Cost Applications"; IEEE Transactions on Computer-Aided Design of Integrated Circuits and Systems, vol. 28(1): 46-59, Jan. 1, 2009.

Xie Qing et al "Variation-Aware Joint Optimization of the Supply Voltage and Sleep Transistor Size for 7nm FinFET Technology"; 2014 IEEE 32nd international conference on computer design, pp. 380-385, Oct. 19, 2014.

Rebaud B et al ,"Timing slack monitoring under process and environmental variations: Application to a DSP performance optimization"; Microelectronics Journal vol. 42 Issue 5, pp. 718-732, Feb. 8, 2011.

Dierickx B et al, "Propagating variability from technology to system Level"; Physics of Semiconductor Devices, pp. 74-79, Dec. 16, 2007.

Zheng K., "A Comparison of Digital Droop Detection Techniques in ASAP7 FinFET"; Research Review. Sep. 2019.

Hongge Chen, "Novel Machine Learning Approaches for Modeling Variations in Semiconductor Manufacturing," Master thesis, Jun. 2017.

The Universal Chiplet Interconnect express (UCIe) Consortium, "Universal Chiplet Interconnect express (UCIe) Specification," Revision 1.0, Feb. 24, 2022.

Nidhal Selmane, Shivam Bhasin, Sylvain Guilley, Tarik Graba, Jean-Luc Danger. "WDDL is Protected Against Setup Time Violation Attacks." CHES, Sep. 2009, Lausanne, Switzerland. pp. 73-83. DOI:10.1109/FDTC.2009.40.

Nidhal Selmane, Shivam Bhasin, Sylvain Guilley, Jean-Luc Danger. "Security evaluation of application-specific integrated circuits and field programmable gate arrays against setup time violation attacks." IET Inf. Secur., 2011, vol. 5, Iss. 4, pp. 181-190. doi: 10.1049/iet-ifs.2010.0238.

Jianfeng Zhang et al, "Parameter Variation Sensing and Estimation in Nanoscale Fabrics"; Journal of Parallel and Distributed Computing; vol. 74, Issue 6, pp. 2504-2511, Jun. 1, 2014. https://doi.org/10.1016/j.jpdc.2013.08.005.

I. A. K. M. Mahfuzul et al, "Variation-sensitive monitor circuits for estimation of Die-to-Die process variation"; 2011 IEEE ICMTS International Conference on Microelectronic Test Structures, Amsterdam, Netherlands; pp. 153-157, Apr. 4-7, 2011. doi: 10.1109/ICMTS.2011.5976878.

Ying Qiao et al., "Variability aware compact modeling and statistical circuit validation on SRAM test array"; Proceedings of the SPIE, vol. 9781, Design-Process-Technology Co-optimization for Manufacturability X, Mar. 16, 2016. DOI: 10.1117/12.2219428.

* cited by examiner

DIE-TO-DIE CONNECTIVITY MONITORING USING A CLOCKED RECEIVER

CROSS-REFERENCE TO RELATED APPLICATIONS

This application claims priority to U.S. Provisional Patent Application No. 63/349,863, filed Jun. 7, 2022, entitled "Die-To-Die Connectivity Monitoring Using a Clocked Receiver," the contents of which are incorporated herein by reference.

BACKGROUND

Semiconductor integrated circuits (ICs) typically include analog and digital electronic circuits on a flat semiconductor substrate, such as a silicon wafer. Microscopic transistors are printed onto the substrate using photolithography techniques to produce complex circuits of billions of transistors in a very small area, making modern electronic circuit design using ICs both low cost and high performance. ICs are produced in assembly lines of factories, termed foundries, which have commoditized the production of ICs, such as complementary metal-oxide-semiconductor (CMOS) ICs.

Typically, ICs are produced in large batches on a single wafer of electronic-grade silicon (EGS) or other semiconductor (such as GaAs). The wafer is cut (diced) into many pieces, each containing one copy of the circuit. Each of these pieces is called a 'die.'

Digital ICs are typically packaged in a metal, plastic, glass, or ceramic casing. The casing, or 'package,' is connected to a circuit board, such as by using solder. Types of packages include a lead frame (though-hole, surface mount, chip-carrier, and/or the like), pin grid array, chip scale package, ball grid array, and/or the like, to connect between the IC pads and the circuit board.

Some modern ICs are in fact a module made up of multiple interconnected ICs (sometime referred to as "chips" or "chiplets") that are configured to cooperate. A typical example is a logic IC interconnected with a memory IC, but many other types exist. There are also many die-to-die (namely, IC-to-IC) connectivity technologies in existence. One example is wafer-level integration featuring high-density connectivity, that is based on a Re-Distribution Layer (RDL) and Through Integrated Fan-Out Vias (TIVs), for instance as marketed by Taiwan Semiconductor Manufacturing Company (TSMC), Limited. Another example is system-level integration featuring individual chips bonded through micro-bumps on a silicon interposer, for instance the Chip on Wafer on Substrate (CoWoS) technology marketed by TSMC Limited, and the Embedded Interconnect Bridge (EMIB) technology marketed by Intel Corporation. Both enable High Bandwidth Memory (HBM) subsystems. A third example is three-dimensional (3D) chip stacking technology based on Through Silicon Vias (TSVs), for instance the Chip on Wafer (CoW) and Wafer on Wafer (WoW) technologies marketed by TSMC Limited.

The foregoing examples of the related art and limitations related therewith are intended to be illustrative and not exclusive. Other limitations of the related art will become apparent to those of skill in the art upon a reading of the specification and a study of the figures.

SUMMARY

The following embodiments and aspects thereof are described and illustrated in conjunction with systems, tools and methods which are meant to be exemplary and illustrative, not limiting in scope.

One embodiment is directed to an I/O sensor comprising: a programmable delay line; a delayed clocked receiver having the following inputs: (a) a data signal and a reference voltage that also serve as inputs to a reference clocked receiver that is configured to sample the data signal received from an interconnect lane between two integrated circuits (ICs) of a multi-IC module, and (b) a delayed clock signal received from the programmable delay line, wherein the delayed clock signal is a delayed version of a clock signal that clocks the reference clocked receiver; a comparison circuit configured to compare a data signal output of the delayed clocked receiver and a data signal output of the reference clocked receiver; and a controller configured to: (a) gradually adjust an amount of delay introduced by the programmable delay line, (b) receive a result of the comparison from the comparison circuit, following each gradual adjustment of the delay, and (c) based on at least one of the results and on the amount of delay that caused it, estimate a quality of connectivity between the two ICs over the interconnect lane.

In some embodiments, the programmable delay line comprises a coarse delay line and a fine delay line that are serially connected; each delay step of the coarse delay line is longer than each delay step of the fine delay line; the length of each delay step of the coarse delay line is configured to bring a rising edge of the delayed clock signal in proximity to where the result of the comparison is likely to inverted from a 'pass' to a 'fail,' or vice versa; and the length of each delay step of the fine delay line is configured to detect an exact point where the result of the comparison is likely to be inverted from a 'pass' to a 'fail,' or vice versa.

In some embodiments, the estimation of the quality of connectivity comprises a calculation of an eye pattern parameter of the data signal.

In some embodiments, the eye pattern parameter comprises an eye width, that is calculated based on a time distance between points of inversion of the comparison result at the left and right sides of a Unit Interval (UI) of the data signal.

In some embodiments, the controller is configured to operate the programmable delay line to scan the eye in one direction, in order to detect the points of inversion of the comparison result.

In some embodiments, the controller is configured to select between two eye scanning modes: a first eye scanning mode in which a first side of the eye is scanned by increasing or decreasing the amount of delay introduced by the programmable delay line; and a second eye scanning mode in which a second, opposing side of the eye is scanned by increasing or decreasing the amount of delay introduced by the programmable delay line.

In some embodiments, the clock signal that clocks the reference clocked receiver is a multi-phase clock signal, and wherein: in the first eye scanning mode, one of the phases of the multi-phase clock signal is subject to the increasing or the decreasing of the amount of delay introduced by the programmable delay line; in the second eye scanning mode, a different one of the phases of the multi-phase clock signal is subject to the increasing or the decreasing of the amount of delay introduced by the programmable delay line; and in both the first and the second eye scanning modes, the different one of the phases of the multi-phase clock signal is used to clock the reference clocked receiver.

In some embodiments, the reference voltage is a variable reference voltage; the eye pattern parameter further comprises an eye height; and the controller is further configured to measure the eye height by gradually adjusting the variable reference voltage during each of the first and second eye scanning modes, thereby measuring the eye width at different voltage levels.

In some embodiments, the clock signal that clocks the reference clocked receiver is a multi-phase clock signal; and the controller is further configured to detect a duty cycle distortion of the multi-phase clock signal based on just one of the two eye scanning modes.

In some embodiments, the clock signal that clocks the reference clocked receiver is a multi-phase clock signal that has an approximately 50% duty cycle; and in the calculation of the eye width, the delayed clock signal received from the programmable delay line is only one phase of the multi-phase clock signal.

In some embodiments, the I/O sensor further comprises a compensatory delay element configured to apply a fixed amount of delay to the clock signal, to compensate for an intrinsic delay of the programmable delay line.

In some embodiments, the I/O sensor further comprises a compensatory delay element configured to apply a fixed amount of delay to the data signal, to compensate for an intrinsic delay of the programmable delay line.

In some embodiments, the I/O sensor further comprises a compensatory delay element configured to apply a fixed amount of delay to at least one of the data signal and the clock signal, to compensate for a distance between the reference clocked receiver and the I/O sensor.

Another embodiment is directed to a method for estimating a quality of connectivity between two ICs interconnected by an interconnect lane, the method comprising operating the various elements of the I/O sensor as described above.

In addition to the exemplary aspects and embodiments described above, further aspects and embodiments will become apparent by reference to the figures and by study of the following detailed description.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

DETAILED DESCRIPTION

Figure 1:
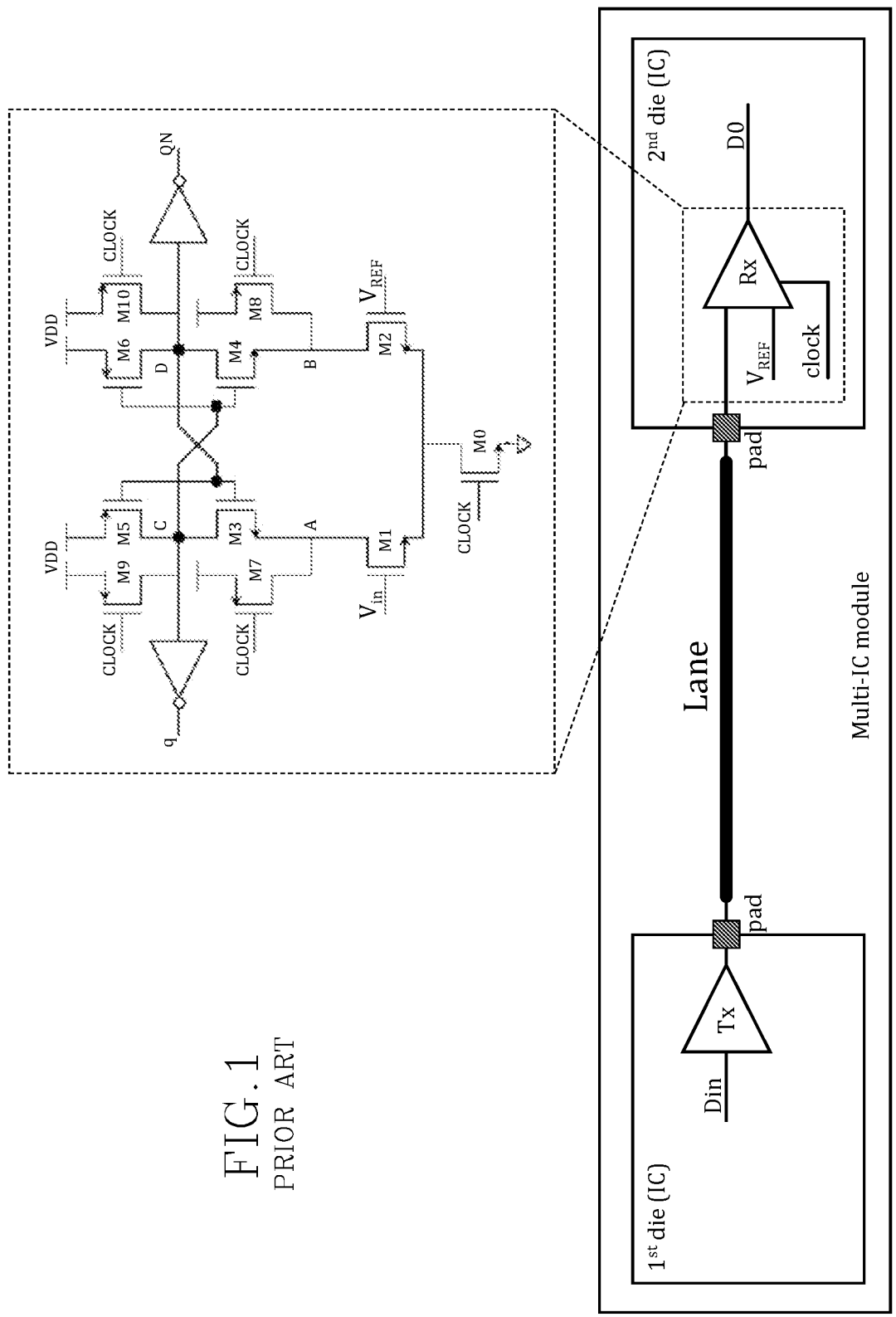
FIG. 1 shows an exemplary die-to-die connection with a clocked receiver.

Disclosed herein are circuits, devices, systems, and methods (generally referred to as an "I/O sensor" or "I/O sensing," respectively) to estimate and monitor a quality of connectivity between ICs of a multi-IC module (sometimes referred to as a "multi-chip module") over an interconnect lane. The estimation may include, for example: measuring an eye pattern parameter (such as eye width and/or eye heigh) of a signal received at one end of the interconnect lane, estimating degradation of the quality of connectivity over time, etc. Optionally, one or more actions may be taken when the quality of connectivity is insufficient, such as replacing a faulty interconnect lane with a spare interconnect lane, reducing transmission rate (also referred to as "data rate") over the faulty interconnect lane, replacing a faulty IC with a new IC (in case the low connectivity quality was the result of a faulty IC and not a faulty interconnect lane), etc.

The term 'multi-IC module,' as referred to herein, may describe a group of interconnected ICs (sometimes called 'chiplets' or 'dies') that are integrated and packaged together, and are configured to cooperate through this interconnection in order to achieve a certain joint functionality. The ICs in the module may communicate with each other through an interconnect bus, for example. Their physical integration may be horizontal, vertical, or both.

The term 'eye pattern,' as referred to herein, may describe a graph in which a digital signal from a receiver is repetitively sampled and applied to the vertical input, while the data rate is used to trigger the horizontal sweep. Eye patterns assist in the evaluation of signal transmission quality such as channel noise and various other phenomena that cause a distortion of the digital signal. From a mathematical perspective, an eye pattern is a visualization of the probability density function (PDF) of the signal, modulo the unit interval (UI). In other words, it shows the probability of the signal being at each possible voltage across the duration of the UI. Commonly measured parameters of the eye pattern are eye width (EW) and eye height (EH).

The multi-IC module to which this disclosure relates may be constructed by any known or later introduced integration technology, which either provides for direct connection between ICs, or indirect connection through an intermediary such as a certain interposer, substrate, circuit board, and/or the like. It is also possible for a multi-IC module to employ both direct and indirect connectivity between various pairs of its integrated ICs. Examples of today's multi-IC module integration technologies include Chip on Wafer on Substrate (CoWoS), Wafer On Wafer (WoW), Chip On Wafer (CoW), and 3D IC. However, embodiments of the invention are certainly beneficial also for any other type of multi-IC module which feature die-to-die (IC-to-IC) connectivity.

The disclosed I/O sensing includes die-to-die connectivity monitoring, particularly determining the quality of the connectivity of a high-speed die-to-die interconnect. Such interconnects may implement wide buses and/or low power (picojoules/bit). Quality issues can be the cause of open-circuit, short-circuit, bridge-short (signal to signal), micro-bump resistance degradation at the receiver side, and/or micro-bump resistance degradation at the transmitter side. In this case, the timing of the signal at the receiver is expected to change and the change can be detected by the disclosed monitoring techniques. Timing effects and power effects of this monitoring are minimal, if not negligible.

Embodiments of this disclosure may be useful, for example, in die-to-die connectivity schemes that employ a clocked receiver (also referred to as a "clocked comparator" or a "switch comparator"). This is prevalent in today's high-speed die-to-die connections, that offer transmission data rates of 4-32 GT/s (Giga Transfers per Second) or beyond.

Reference is made to FIG. 1, which shows an exemplary die-to-die connection with a transmitter (belonging to a first IC of a multi-IC module) at the left side and a receiver (belonging to a second IC of the multi-IC module) at the right side, according to prior art. The two ICs are interconnected using an interconnect lane; the physical connection between each IC and the lane is at a pad—typically a micro-bump, a pin, etc. This receiver is based on a clocked receiver configuration (shown in the enlarged portion of the figure), in which input data is compared, using a comparator, against a reference voltage ($V_{REF}$) at the clock rising or falling edges.

If the voltage difference ($V_{in}$–$V_{REF}$) is larger than a certain value (depending on the comparator's implementation and design, e.g., 1-20 mV) at the clock edge, the output DO will resolve to $V_{DD}$. Otherwise, DO will resolve to Vss.

According to principles of the present disclosure, when monitoring the quality of connectivity of an interconnect lane that uses a clocked receiver as a sampler, the monitoring circuit should implement the same type of receiver to generate a reliable diagnosis. That is, by using a monitoring circuit (referred to herein as an "I/O sensor") which is a replica of the monitored circuit, it can generally be ensured that any detected anomalies are real and are not caused by the monitoring itself.

Therefore, the disclosed I/O sensor that is used to monitor and characterize a lane that is based on clocked receiver sampler, also implements a clocked receiver sampler. In the various I/O sensor versions described below, the principle is to use a delayed clocked receiver in parallel to a reference clocked receiver (the latter being essentially the same clocker receiver that would have been used in the IC even in the absence of the I/O sensor). Both of these clocked receivers receive the same data signal ($D_{in}$) from the lane and the same reference voltage ($V_{REF}$), but are clocked differently: whereas the reference clocked receiver is clocked directly by an original clock signal, the delayed clocked receiver is clocked by a delayed version of that original clock signal. By comparing the data output (D_s_d) of the delayed clocked receiver with the data output (D_s) of the reference clocked receiver, it is possible to evaluate the interconnect quality of the lane, for example by measuring an eye width of the data signal ($D_{in}$). The evaluation/measurement may be performed by a controller included in the I/O sensor, which controls the amount of delay, receives the result of the comparison, and also selects input clock signal(s) if needed. The controller may further track the Eye Width over time (for example, over days, weeks, months, and years) to detect degradation of the lane; a diminishing Eye Width indicates degradation. The controller may further determine whether the Eye Width is smaller than a preset threshold, and trigger, in response, the replacement of the faulty lane by another, spare lane.

Notably, in all the I/O sensor versions described below, the estimation of the interconnect quality and the measurement of the eye pattern parameter may be performed, advantageously, while the lane transfers real data, in 'mission mode.' There is no need to stop the normal operation of the lane to perform the evaluation and measurement, since the I/O sensor operates in parallel to the lane's sampling element (clocked receiver) and does not interfere with that sampling element's operation.

Figure 2:
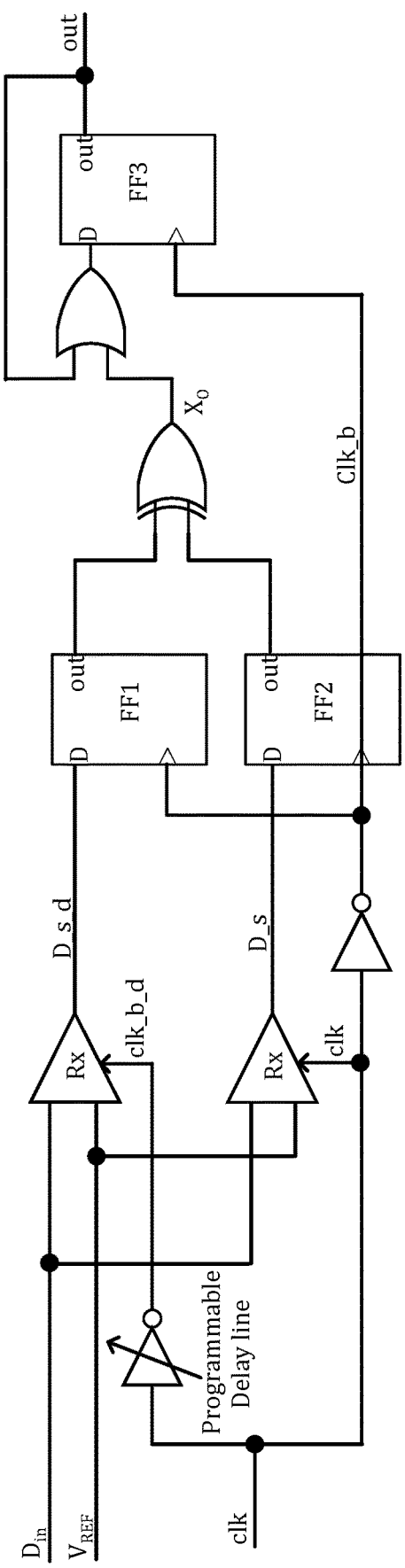
FIG. 2 shows a first version of an exemplary I/O sensor that is based on a clocked receiver.

FIG. 2 shows a first version of an exemplary I/O sensor that is based on a clocked receiver. The data input ($D_{in}$) drives two clocked receivers (the two Rx elements shown) which are connected, at one of their ports, to the connectivity lane. The lower Rx ("reference clocked receiver") may be the one preexisting in the IC design, and the upper Rx ("delayed clocked receiver") is the one added for monitoring purposes.

A voltage reference $V_{REF}$ is connected to the other port of each of the clocked receivers, and is used as a comparison level to Dm.

The clock signal (clk) directly drives the lower clocked receiver.

An inverted delayed version (clk_d_b) of the clock signal is generated by a programmable delay-line. The delayed clock version (clk_b_d) is used to clock the upper clocked receiver.

The two clocked receivers therefore sample the data ($D_{in}$) at different times, and generate two outputs, D_s and D_s_d.

These two outputs are then sampled by the two shown flip-flops (storage elements, indicated FF1 and FF2), and compared by a comparison circuit, such as the shown XOR gate. FF1 and FF2 are clocked by an inverted clock signal, Clk_b. If D_s_d is equal to D_s, the XOR output ($X_0$) will be logical 0 (indicating 'pass'), and if D_s_d is different than D_s, the XOR output will be a logical 1 (indicating 'fail').

The last flip-flop (storage element, indicated FF3) may be used to store the XOR value at the first time that it was change to a logical 1, by the following configuration: FF3 is clocked by Clk_b; the data input to FF3 is from an OR gate, whose first input is $X_0$ and whose second input is the output of FF3. The last flip-flop is optionally also regarded as part of the comparison circuit, as it stores the last change in the comparison result.

A controller embedded in the IC (not shown in this figure) may control the amount of incremental delay introduced by the programmable delay line, and may also receive the output of FF3. Hence, the controller is aware of the specific amount of delay that caused the first 'fail' in $X_0$, and may utilize this knowledge to calculate an eye width of $D_{in}$.

Figure 3:
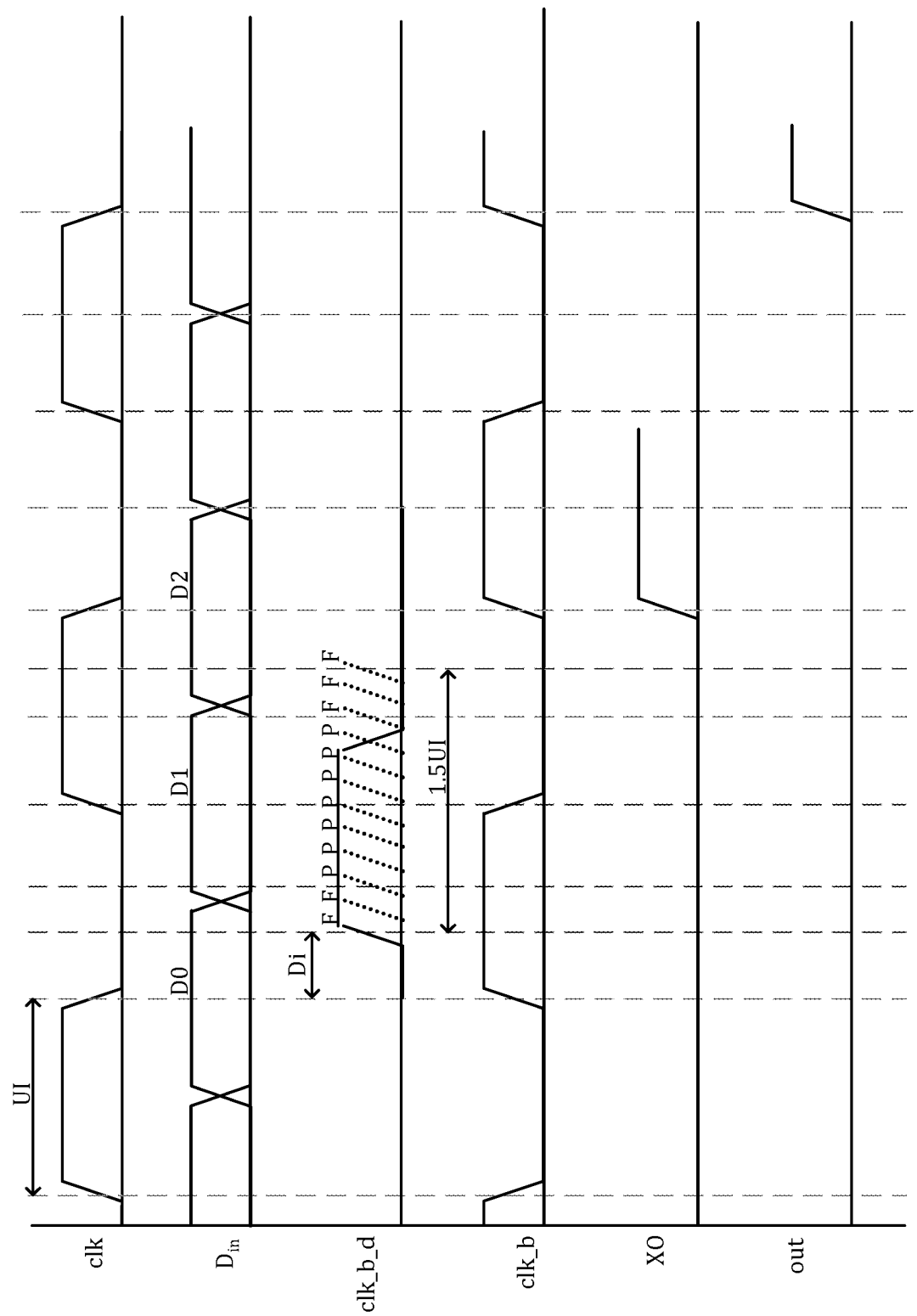
FIG. 3 is a timing diagram showing a search mechanism to detect/measure the Eye-Width (EW) of an input signal, using the I/O sensor of FIG. 2.

The operation of the I/O sensor of FIG. 2 may be better understood with reference to FIG. 3, which is a timing diagram illustrating a search mechanism (method) to detect/measure the eye width of an input signal at $D_{in}$.

In the diagram, the clock signal (clk) that is clocking the lower clocked receiver is sampling the value of D1 data at the middle of the unit interval (UI), during the communication (data transfer).

Clk_b_d that is generated by the programmable delay line, is used to scan the Eye from left-to-right or from right-to-left by clocking the upper clocked receiver with differing levels (shown with dotted lines of the rising clock edge) of delay compared to the clk signal.

The outputs of the two clocked receivers are sampled by the two flip-flops (FF1 and FF2) at the falling edge of clk signal, and then compared by the XOR.

If the flip-flops happened to sample different values, the XOR output will set to a logical 1. The last flip-flop (FF2) will store this failure indication until it will be reset by the controller in a subsequent scan sequence. The controller, of course, may be configured to store in a non-volatile memory on the IC a record of all past failure indications along with the time each failure was indicated.

The scan sequence (method) may be as follows:

Starting from the minimum delay of the programmable delay line, clk_b_d is sampling the value of D0 data. The clk signal is sampling D0.

Since D0 is not equal to D1, Failure is expected, (shown by the letter F).

After that, the programmable delay line increases its delay in small increments, and at the point (delay line position) that the two clocked receivers are sampling the same value, the detection is transformed (inverted) into Pass (shown by the letter P).

The delay line then continues to increase its delay value, until the two clocked receivers are again sampling different values. Then the comparison indicates a Failure (shown by the letter F).

The eye width may be measured as follows:
1. Record the position of the programmable delay line at the 1$^{st}$ Fail-to-Pass (F→P) transition.
2. Record the position of the programmable delay line at the 1$^{st}$ Pass-to-Fail (P→F) transition.
3. Calculate the number of delay line increments (K) between the 1$^{st}$ Fail-to-Pass and the 1$^{st}$ Pass-to-Fail.
4. Convert K into time (for example, in units of picoseconds) by multiplying K by the delay line 'tick' (d), which is the time duration of each incremental step which the delay line is programmed to perform.

The disclosed I/O sensor may also be used with die-to-die connectivity configurations that utilize a multi-phase clock to increase data transmission bandwidth. In such configurations, a certain sampling clock frequency (e.g., 2.4 GHz) may span multiple clock phases (e.g., 8 phases), to yield larger bandwidth (e.g, 2.4×8=19.2 GT/s).

Figure 4:
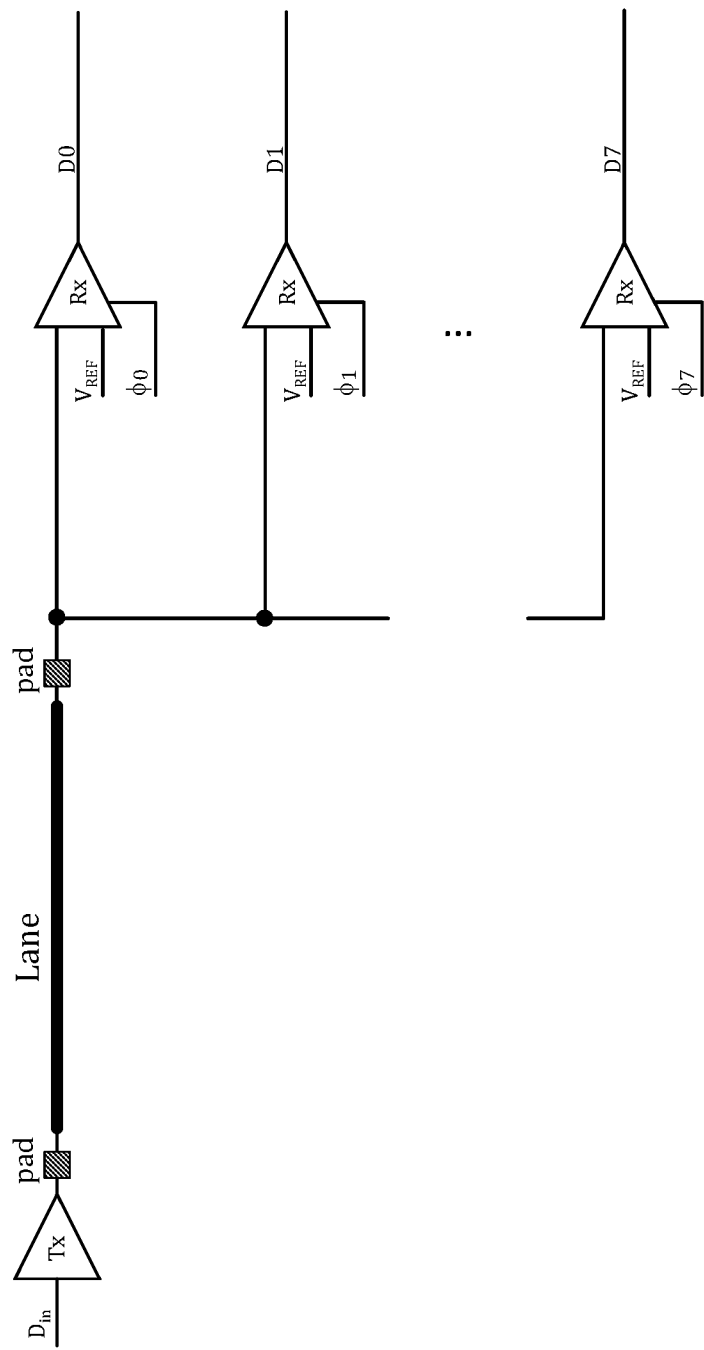
FIG. 4 shows an exemplary die-to-die connectivity configuration that utilizes a multi-phase clock.

Such exemplary configuration is shown in FIG. 4, where there are eight clocked receivers, each clocked by a different phase of the clock (Φ0 through Φ7), yielding eight different data outputs (D0 through D7). Such configurations may include a different number of clock phases, such as 2-32 phases or even more.

Figure 5:
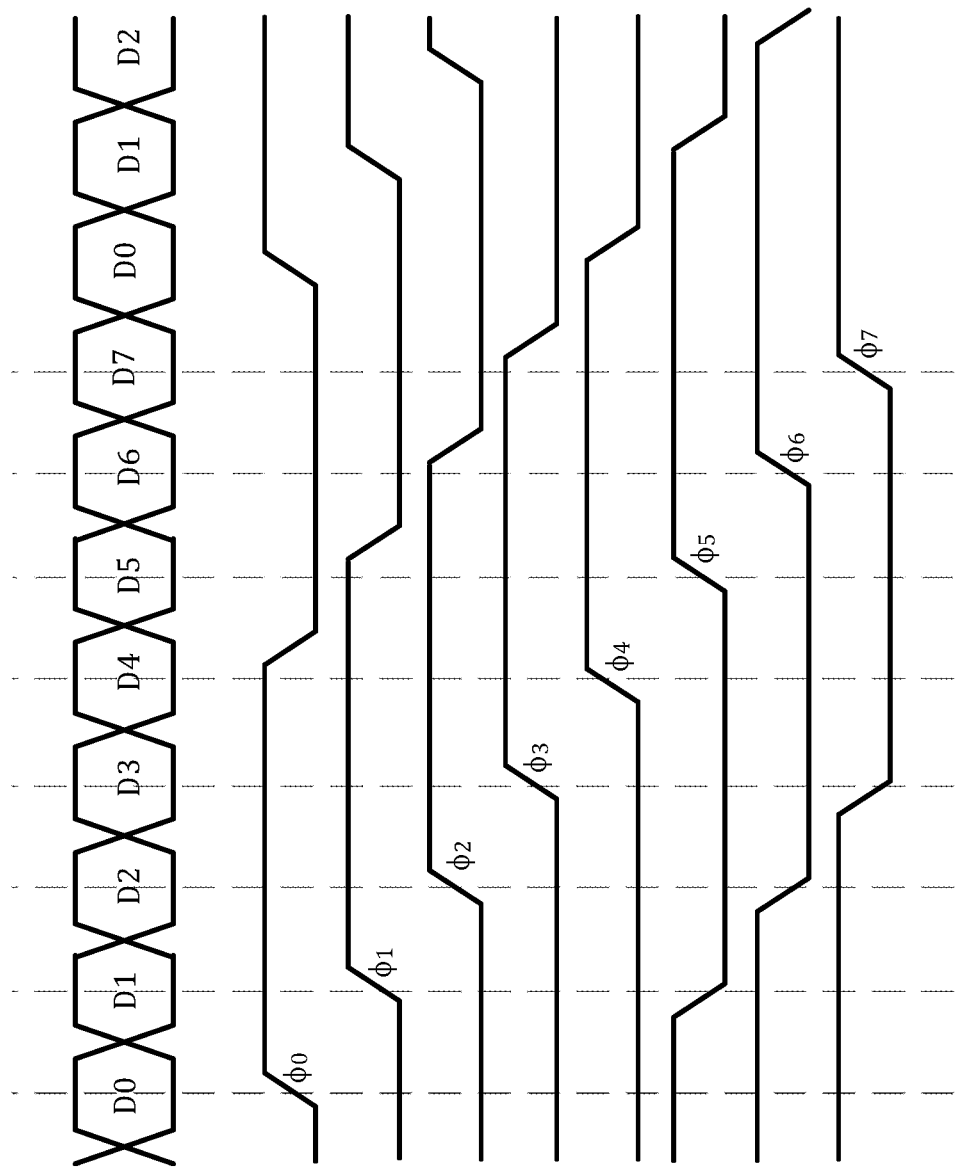
FIG. 5 is a timing diagram showing the timing of the clock phases of FIG. 4.

FIG. 5, in turn, is a timing diagram illustrating the timing of the eight clock phases and eight data outputs of the clocked receivers of FIG. 4.

Figure 6:
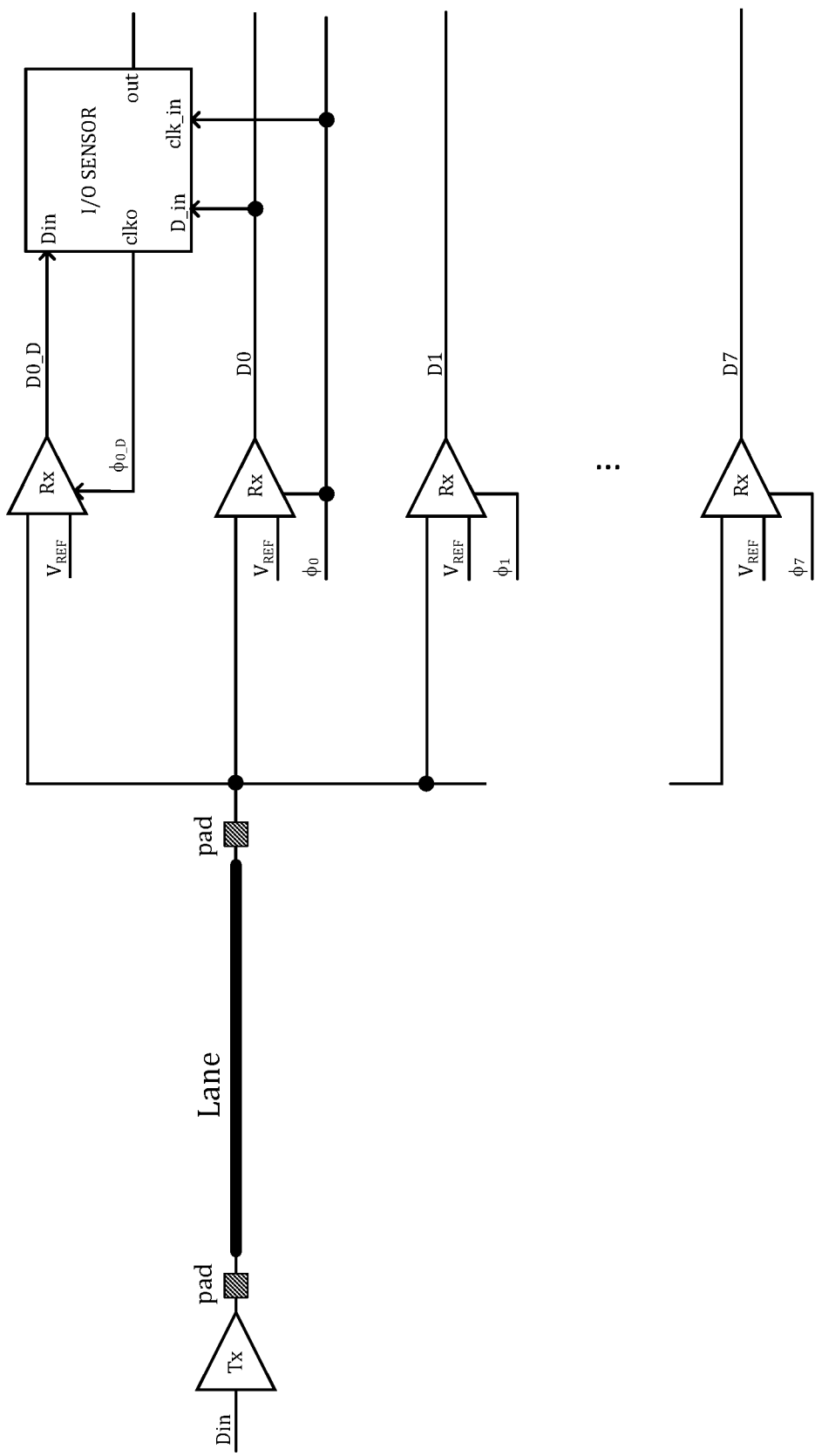
FIG. 6 shows an implementation of the I/O sensor of FIG. 2 with the multi-phase clock configuration of FIG. 4.

Reference is made to FIG. 6, which illustrates an implementation of the disclosed I/O sensor with a multi-phase clock configuration (such as the one of FIG. 4). In this implementation, the I/O sensor may be configured with the following changes compared to FIG. 2:
1. One representative receiver is used per eight receivers.
2. The reference data (D_in) is generated by the lane receiver (D0).
3. The delayed clock version (clko) is generated by the I/O sensor to drive an external clocked receiver, generating the delayed data D0_D (however, it is also possible for this clocked receiver to be included in the I/O sensor itself).

As an alternative to coupling the I/O sensor to just one representative clocked receiver of the multi-phase clock configuration, it is possible to couple the I/O sensor to multiple clocked receivers using a multiplexer that selects a different clocked receiver every time. This alternative configuration is not shown in the figure.

Figure 7:
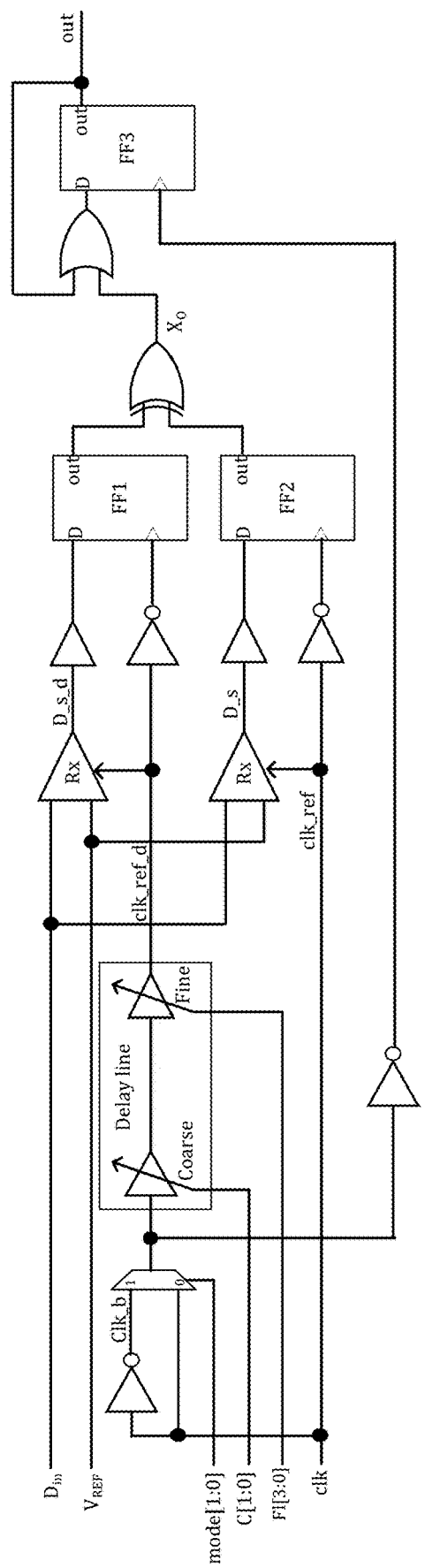
FIG. 7 shows a second version of an exemplary I/O sensor that is based on a clocked receiver.
Figure 10:
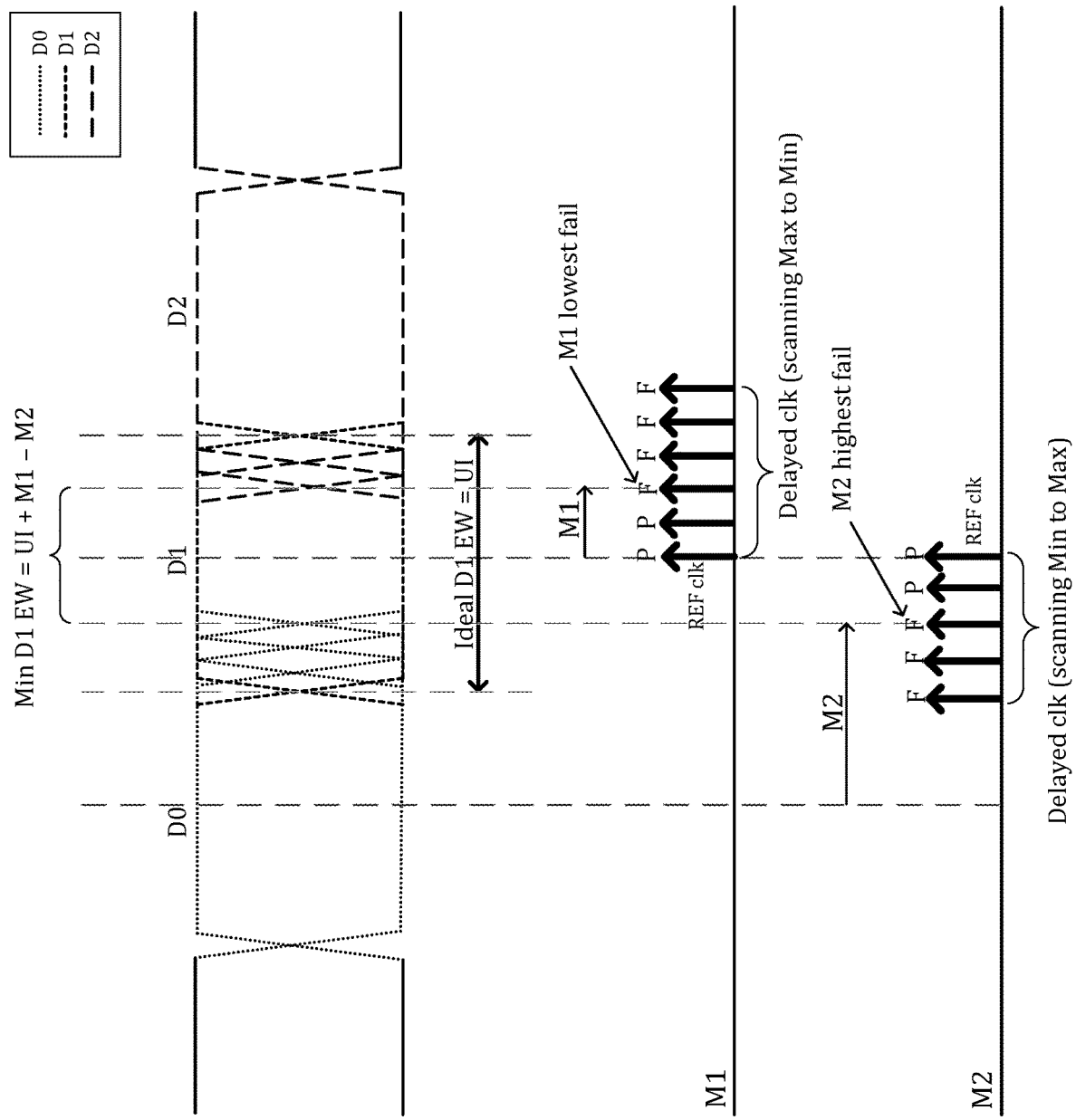
FIG. 10 shows a timing diagram showing a search mechanism to detect/measure an eye width (EW) of an input data signal, using the I/O sensor of FIG. 7, 8 or 9.

Reference is made to FIG. 7, which illustrates a second version of an I/O sensor that is based on a clocked receiver; and to FIG. 10, which illustrates a timing diagram of the search mechanism to measure the eye width of an input signal, using the I/O sensor of FIG. 7. The second version of the I/O sensor operates similar to its first version, with certain differences indicated below and shown in FIG. 7.

The second I/O sensor version allows measuring the eye width by performing two measurements, each in a separate scan mode of operation selectable by a multiplexer.

In the first measurement mode (M1, mode-1) the rising edge of the clk signal is used as a reference to measure the right-side timing shift of the EW. This is done by shifting (adjusting the delay of) the clk signal by the delay line to find the lowest fail indication (assuming that the delay-line delay is shifting from its max value to its min value), or to find the highest pass indication (assuming that the delay-line is shifting from its min value to its max value).

In the second measurement (M2, mode-2), the rising edge of the clk signal is used as a reference, while the rising edge of the clk_b signal (an inversion of clk) is delayed by the delay-line to measure the left-side timing shift of the EW. This is done by shifting the clk_b signal by the delay line to find the highest fail indication (assuming that the delay-line is shifting from its min value to its max value), or to find the lowest pass indication (assuming that the delay-line is shifting from its max value to its min value).

The minimal EW is then calculated as: Min EW=UI+M1−M2. UI represents the data unit-interval i.e., 1/Data-rate (in GT/s). Each of M1 and M2 represents the delay provided by the delay-line when FF3 first indicated a "fail" at the respective mode.

The delay-line may be composed from two parts, a coarse delay-line and a fine delay-line that are serially connected, such that the combination of their delays provides the overall delay of the delay-line. Each step of the coarse delay line may increase the delay by a value between ½ and ⅝ of the UI length, while each step of the fine delay line may increase the delay by a value between ⅛ and ¼ of the UI length, for example. In general, the ratio of the length of the step delay between the coarse and fine delay lines may be 2:1 or greater.

The coarse delay-line is a controlled delay element that enables the I/O sensor to operate at multiple/wide-range of data-rates (clock frequencies) while using the same variable (fine) delay-line. The coarse delay-line is configured based on the data-rate to bring the edge of the scanning clock to the region of fail (namely, to a proximity of where a transition from a 'fail' to a 'pass' result, or vice versa, will likely be detected). The fine delay-line is than used for finer scanning, to detect the exact point of transition from pass to fail or vice versa.

The coarse and fine delay lines are both controllable by the same controller (not shown in the figure), embedded in the IC and optionally being part of the I/O sensor, which controller also receives the output of FF3 as well as controls the multiplexer.

Figure 8:
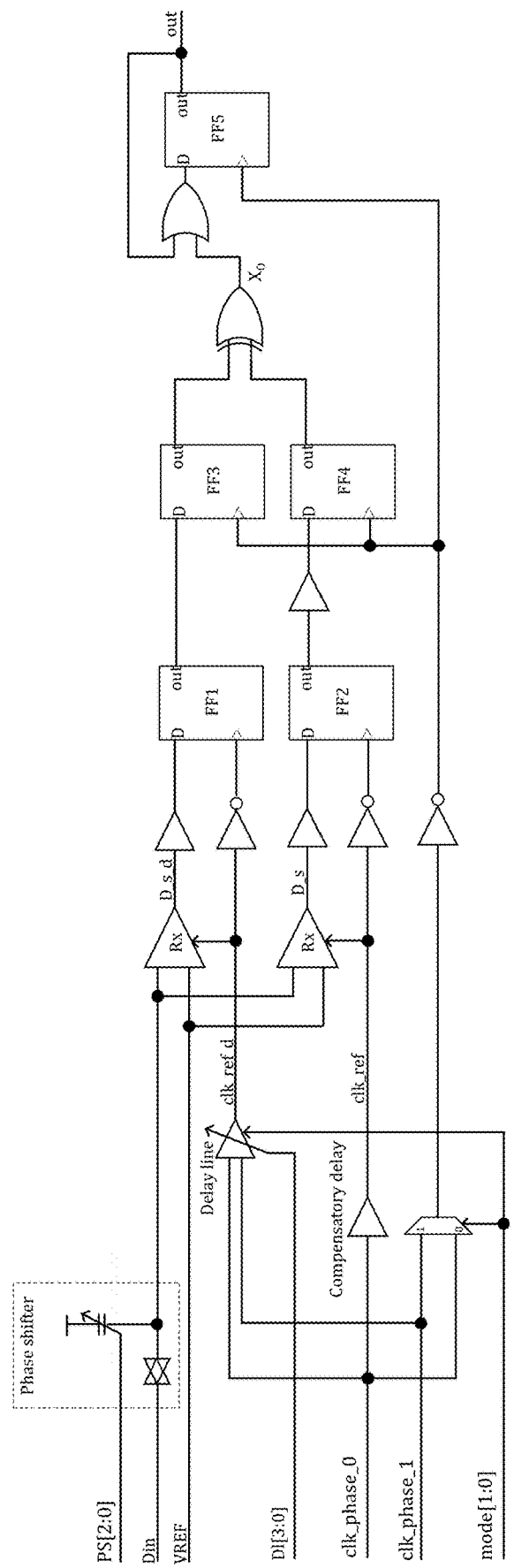
FIG. 8 shows a third version of an exemplary I/O sensor that is based on a clocked receiver.

Reference is made to FIG. 8, which illustrates a third version of an I/O sensor that is based on a clocked receiver; and to FIG. 10, which illustrates the timing diagram of the search mechanism to detect/measure the eye width of an input signal, using the I/O sensor of FIG. 8 (this timing diagram is the same for the I/O sensor of FIG. 7).

The third version I/O sensor is capable of operating at very high data-rates (frequencies), such as 32GT/s and above, by using two input clocks of opposite phases (clk_phase_0 and clk_phase_1) that directly clock the delay-line and the reference clocked receiver that generates the D_s output. Because of these high data rates, two optional compensatory delay elements may be included in this version of the I/O sensor: a phase shifter that applies a fixed delay to $D_{in}$, and a compensatory delay buffer that applies a fixed delay to the clk_phase_0 signal. It is also possible to include just one of these. The fixed delay may be of 3-12 picoseconds (or beyond, if necessary), which is roughly equivalent to the intrinsic delay of the programmable delay line. That intrinsic delay is the delay effected by the programmable delay line even when it is not set to apply any delay; its very existence in a certain signal path causes a slight slowing of any signal passing through it. By slightly delaying $D_{in}$, it can be ensured that each data signal arrives at both clocked receivers almost at the same time (with a maximum variance of, for example, no more than 3 picoseconds); similarly, by slightly delaying the clk_phase_0 signal, it can be ensured that, when the delay line is set to introduce a certain delay, the clk_phase_0 signal will arrive at the delayed clocked receiver at almost the set delay (with a maximum variance of, for example, no more than 3 picoseconds) and not much later than that. In sum, these compensatory delay elements help ensure that apples are compared to apples—the outputs of the two clocked receivers are compared under the same starting conditions.

The third I/O sensor version allows to measure the eye width by performing two measurements in two separate scan modes, selectable using a multiplexer (similar to the second version). The EW is extracted at the same method described above. Clk_phase_0 is used as a reference clock for both M1 and M2 measurements, clk_phase_0 is the delayed clock at M1 measurement, and clk_phase_1 is the delayed clock at M2 measurement.

In the first measurement (M1, mode-1) the rising edge of the clk_phase_0 signal is used as a reference to measure the right-side timing shift of the EW. This is done by shifting the clk_phase_0 signal by the delay line to find the lowest failure indication (assuming that the delay-line is shifting from its max value to its min value), or to find the highest pass indication (assuming that the delay-line is shifting from its min value to its max value).

In the second measurement mode (M2, mode-2), the rising edge of the clk_phase_0 signal is used as a reference to measure the left-side timing shift of the EW. This is done by shifting the clk_phase_1 signal by the delay line to find the highest fail indication (assuming that the delay-line is shifting from its min value to its max value), or to find the lowest pass indication (assuming that the delay-line is shifting from its max value to its min value).

The minimal EW is then calculated as: Min EW=UI+M1−M2.

Clk_phase_0 and clk_phase_1 represent two adjacent clock phases in a multi-clock-phase system, while clk_phase_0 is a lead clock phase and clk_phase_1 is a clock phase lagged by UI. The third I/O sensor version can be used to measure the EW of each data index (more than two) in a multi-clock-phase system by connecting every two adjacent clock phases to the I/O sensor. For example, in a 4 clock-phase system, the following clock-phase pairs [lead, lag] can be measured: [clk_phase_1, clk_phase_0], [clk_phase_2, clk_phase_1], [clk_phase_3, clk_phase_2]. This can be implemented by adding an input selector (multiplexer), as those of skill in the art will readily appreciate.

Figure 9:
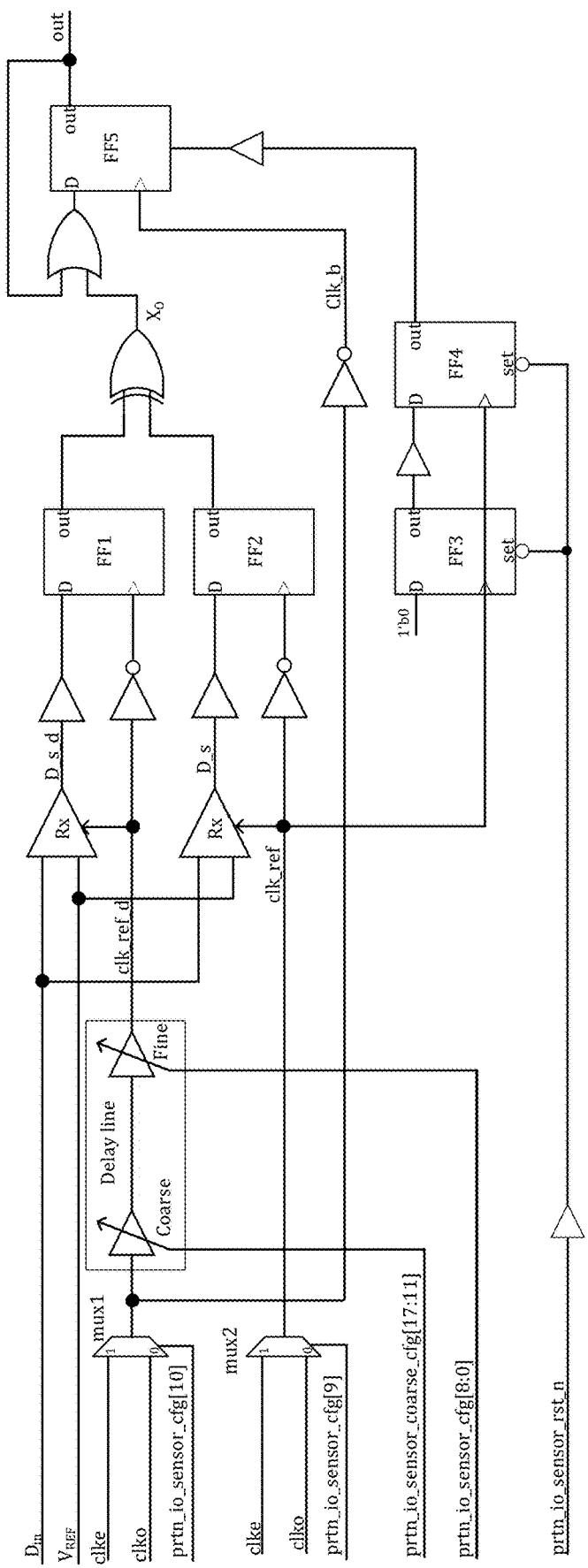
FIG. 9 shows a fourth version of an exemplary I/O sensor that is based on a clocked receiver.

Reference is now made to FIG. 9, which illustrates a fourth version of an I/O sensor that is based on a clocked receiver; and to FIG. 10, which illustrates the timing diagram of the search mechanism to detect/measure the eye width of an input signal, using the I/O sensor of FIG. 9 (this timing diagram is the same for the I/O sensors of FIGS. 7 and 8).

The fourth version I/O sensor is capable of measuring the eye width per each clock phase in a multi-phase clock, wide frequency range system. For example, such a system utilizes a multi-phase clock to sample a wide data-rate transmission (e.g., 6.4GT/s to 3.2GT/s) with multiple clock phases (e.g., 2). The I/O sensor can measure the EW with respect to each of the clock phases, clke and clko.

As FIG. 9 shows, there are two clock phases, clock-even (clke) and clock-odd (clko). The phase between clke and clko is 180 degrees, such that clke samples the data at the even locations of the data stream, and clko samples the data at the odd locations of the data stream. Other configurations intended herein may include a different number of clock phases, such as four phases or even more, and those of skill in the art will recognize the adaptations to this example required to facilitate that number of clock phases.

The fourth version I/O sensor implements two input multiplexers, mux1 and mux2, to select each of the clock phases in the system to be used as a reference clock, clke or clko. The I/O sensor will measure the EW per the selected clock phase in a two-mode measurement technique as described above.

To measure the EW with respect to clke: In mode 1, both mux1 and mux 2 select clke. In mode 2, mux1 selects clko and mux2 selects clke.

To measure the EW with respect to clko: In mode 1, both mux1 and mux 2 select clko. In mode 2, mux1 selects clke and mux2 selects clko.

Figure 11:
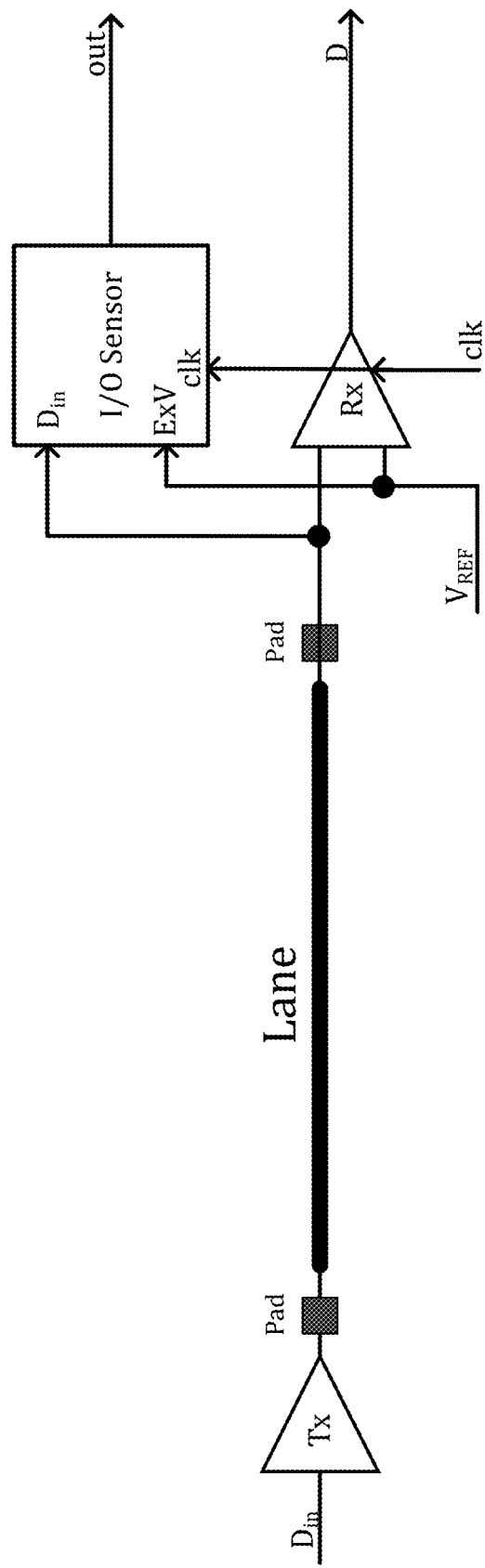
FIG. 11 shows an exemplary die-to-die connectivity configuration that utilizes the I/O sensor of FIGS. 7 and 8.

Reference now is made to FIG. 11 that shows an exemplary die-to-die connectivity configuration that utilizes any of the first, second, or third versions of the I/O sensor. This I/O sensor is located close to the lane sampling element, the reference clocked receiver (Rx). The I/O sensor input signal is connected to the lane to receive $D_{in}$, and the Rx clock is used to also clock the I/O sensor. The Rx $V_{REF}$ is used as a reference voltage also to the I/O sensor's own (delayed) clocked receiver.

Figure 12:
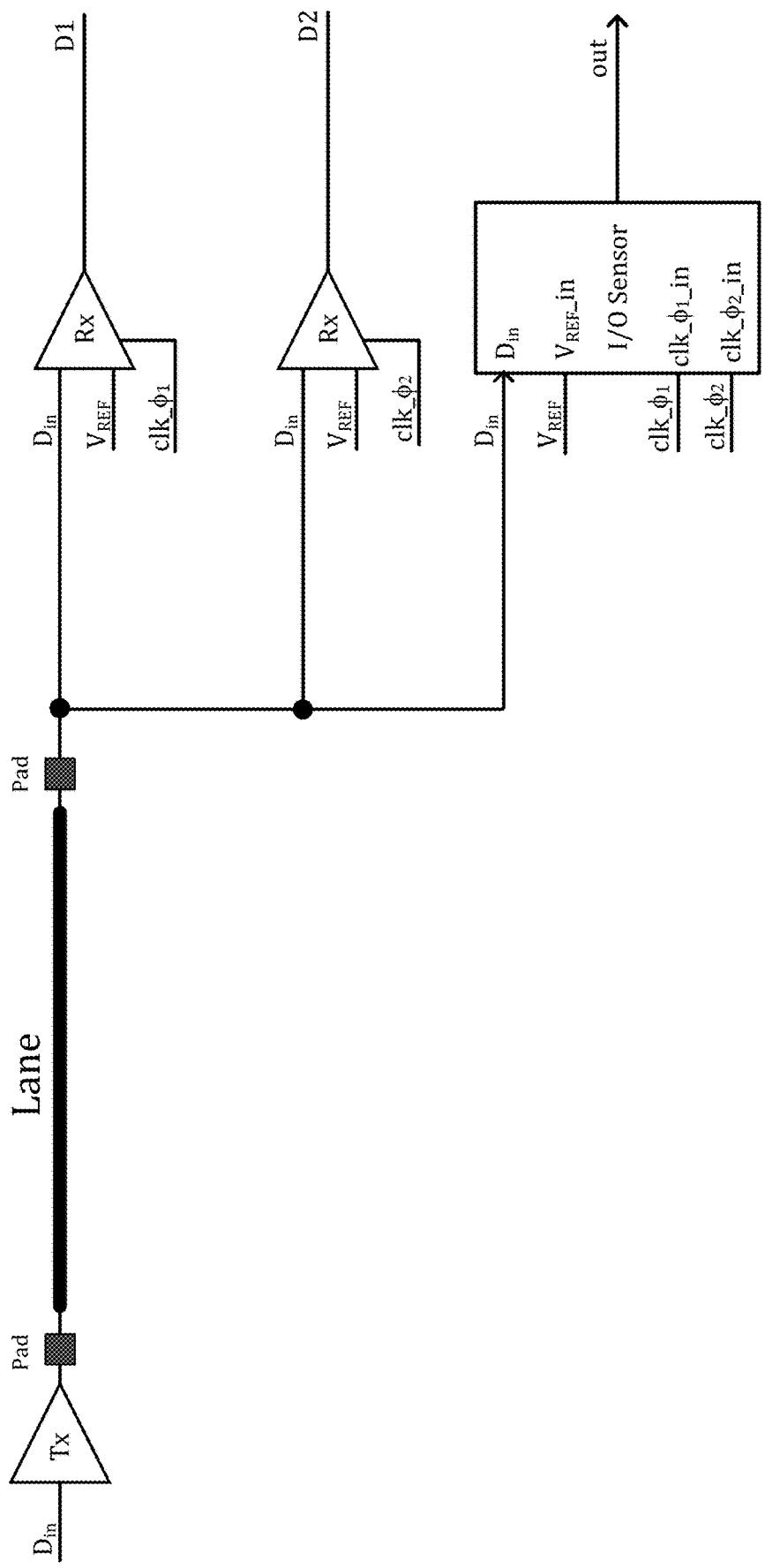
FIG. 12 shows another exemplary die-to-die connectivity configuration that utilizes the I/O sensor of FIG. 9.

Reference now is made to FIG. 12 that shows an exemplary die-to-die connectivity configuration that utilizes the fourth I/O sensor version. The I/O sensor is located close to the lane sampling elements, the clocked receivers (Rx). The I/O sensor input signal is connected to the lane to receive $D_{in}$, and the two clock phases of the respective Rx elements are used to also clock the I/O sensor. The Rx $V_{REF}$ is used as a reference voltage to the I/O sensor's own (delayed) clocked receiver.

Figure 13A:
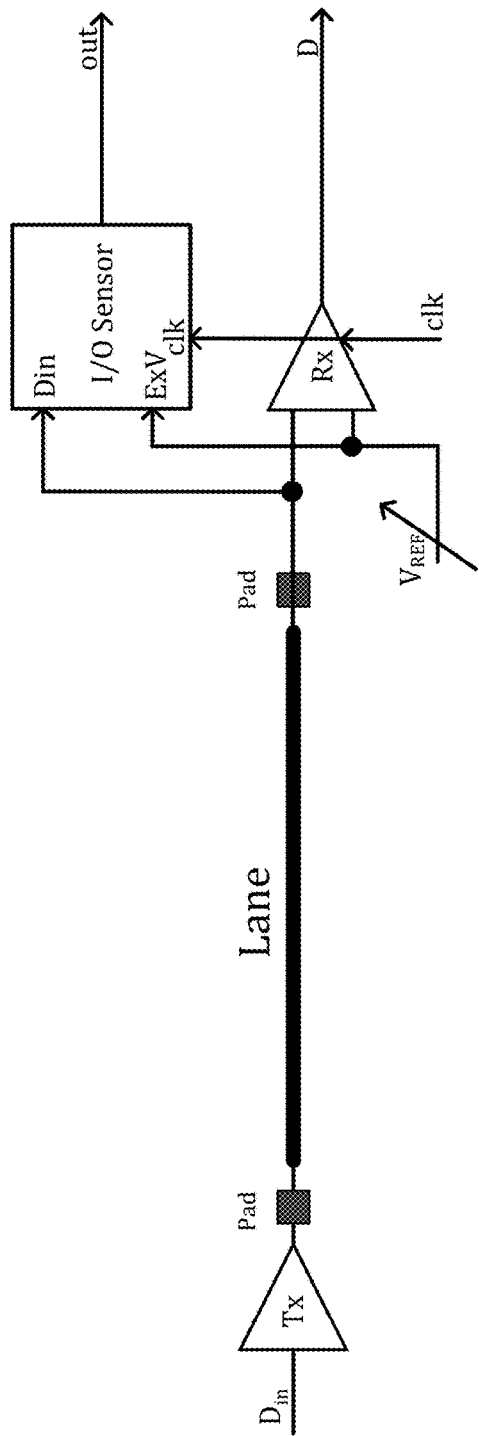
FIG. 13A shows another exemplary die-to-die connectivity configuration that utilizes the I/O sensor of FIGS. 2 and 7-9, with an added capability of measuring eye height (EH)
Figure 13B:
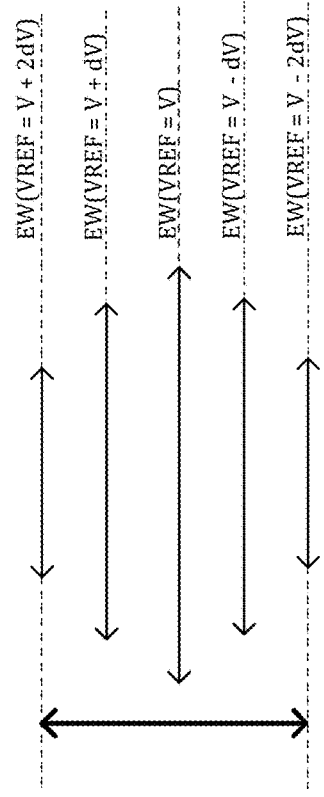
FIG. 13B shows a method for measuring the eye height with the configuration of FIG. 13A.

Reference is now made to FIG. 13A that shows an exemplary die-to-die connectivity configuration that uses any of the above-mentioned I/O sensor versions, with the added capability of measuring the Eye Height (EH) using a variable $V_{REF}$. To measure the Eye Hight, as illustrated in FIG. 13B, M1 and M2 measurements are made vs. different $V_{REF}$ values, such that the eye width is now calculated per each of the different $V_{REF}$ points. Eye height now can be calculated per a pre-defined Min Eye Width, (e.g., $V_{REF}$+/−2dV).

Figure 14:
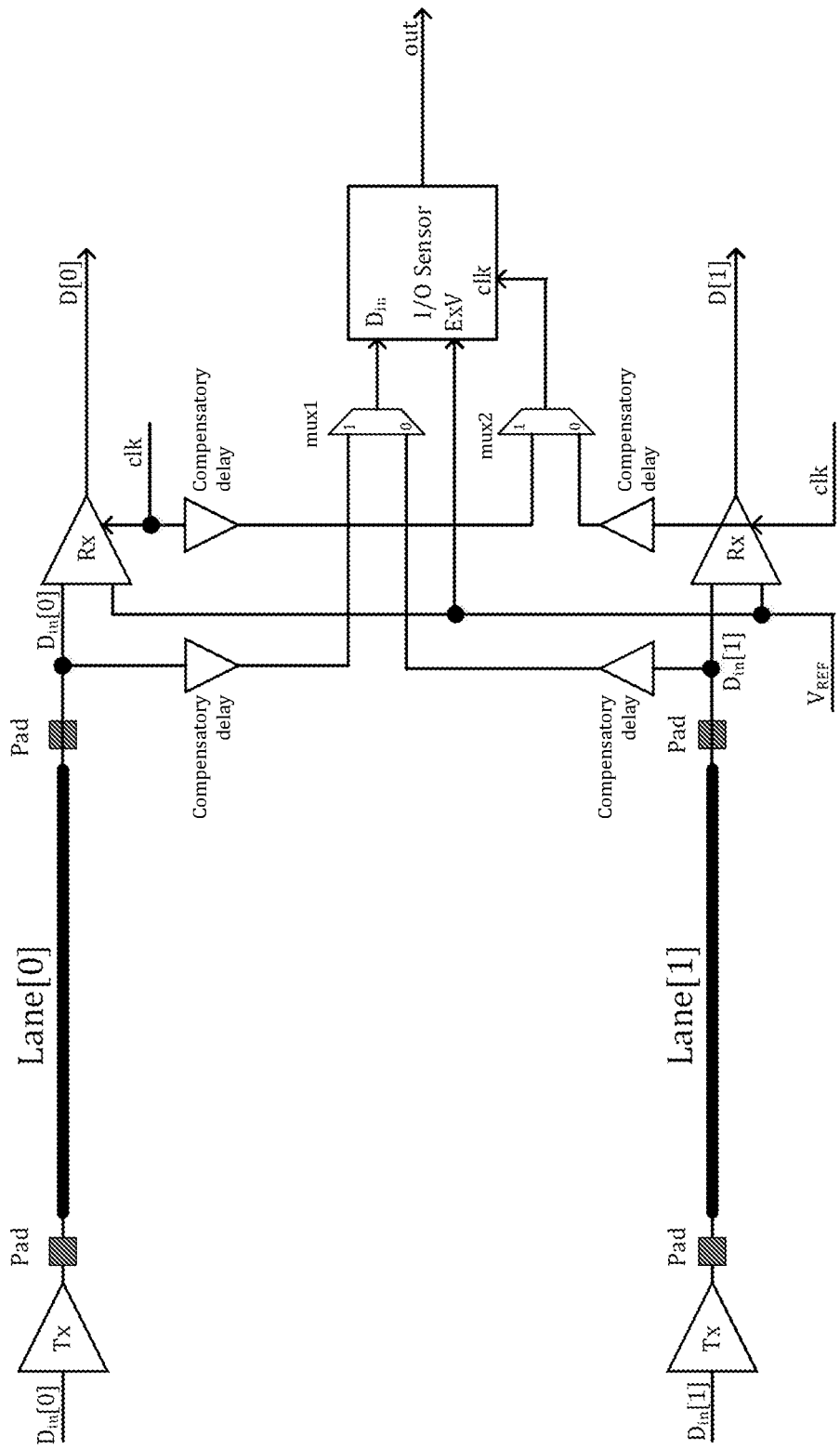
FIG. 14 shows another exemplary die-to-die connectivity configuration that utilizes the I/O sensor of FIGS. 2 and 7-9, with an added capability of using a single I/O sensor for multiple clocked receivers.

Reference is now made to FIG. 14, that show an exemplary die-to-die connectivity configuration that uses any of the above-mentioned I/O sensor versions, with the capability to use one I/O sensor per multiple reference clocked receivers (Rx), for example two. In this configuration, each of the reference clocked receivers is connected to the I/O sensor such that its clock-to-data delay difference remains substantially unchanged regardless of the distance between the clocked receivers. The delay that it intrinsic to that distance (namely, the signal propagation time proportional to the distance of the path) may be compensated by the illustrated compensatory delay buffers, which apply fixed amounts of delay pre-calculated according to the pertinent distances. Keeping the same delay difference between the data signal(s) and clock signal(s) at the input of the I/O sensor, allows measuring the EW and EH based on M1+M2 measurements in a reliable way; namely, the measured EW and EH will be equal to the EW and EH at the reference clocked receivers themselves. The two multiplexers shown in this figure, mux1 and mux2, can be implemented outside the I/O sensor or as part of the I/O sensor.

Figure 15A:
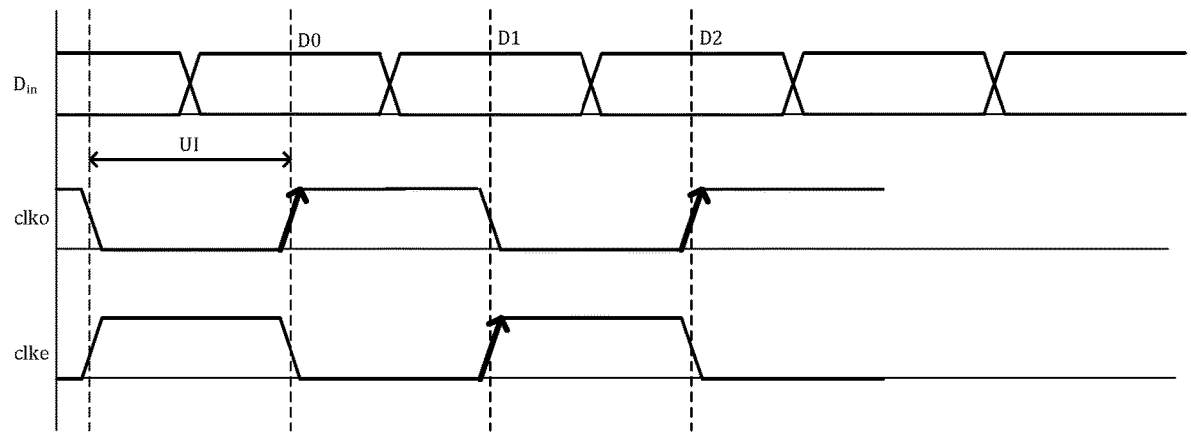
FIGS. 15A and 15B show timing diagrams of a normal multi-phase clock duty cycle and an abnormal (distorted) multi-phase clock duty cycle, respectively.
Figure 15B:
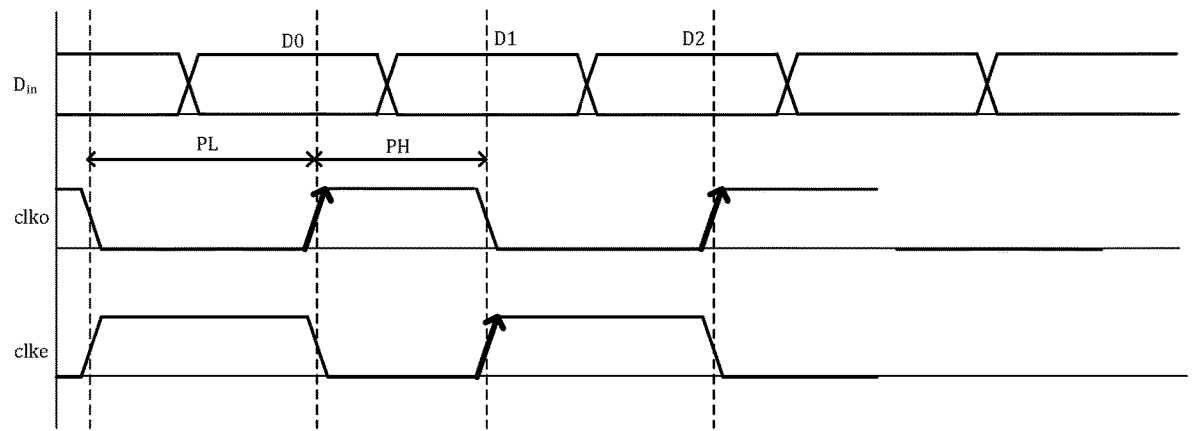

In the third and fourth I/O sensor versions, where a multi-phase clock is used, a duty cycle distortion of such clock may be detected and/or measured using a technique described below. Such distortion is exhibited by different, mismatched periods of the different clock phases. Reference is made to FIGS. 15A and 15B, which show timing diagrams of a normal multi-phase clock duty cycle and an abnormal (distorted) multi-phase clock duty cycle, respectively. The normal multi-phase clock exhibits a duty cycle of 50%, with a consistent UI and equal distances between the rising edges of each clock phase signal, clko and clke. In the abnormal multi-phase clock, however, there is no consistent UI. With respect to clko, its 'phase low' (PL) period is longer than its 'phase high' (PH) period, and the opposite phenomenon can be observed in clke. The distances between the rising edges of each of these clock phase signals are unequal. A duty cycle different than 50% is generally undesired in multi-phase clocked receivers.

To detect such duty cycle distortion, and to optionally measure the distorted duty cycle, two measurements may be performed: a measurement in mode 1 using clke (M1e), and a measurement in mode 1 using clko (M1o). The distortion is then given by M1e-M1o. As an alternative, the two measurements may include a measurement in mode 2 using clke (M2e), and a measurement in mode 2 using clko (M2o). Here, the distortion is given by M2e-M2o.

Various methods to measure the eye width (Min EW) were described above in the context of the the I/O sensor versions where a multi-phase clock is used (second, third, and fourth versions). These methods necessitated operating two scanning modes. A simpler method to measure the eye width may be used, however, when it is known that the duty cycle of the multi-phase clock is not distorted (whether by measuring the distortion as described above or by knowing, by other tests, that no distortion is to be expected). This method only requires a single mode of scanning, in which the lowest fail and the highest fail are determined for one of the clock phases (there is no need to measure the other clock phase, due to the 50% duty cycle assumption). The eye width is then given as: UI+lowest fail—highest fail. Namely, the duration of the UI, plus the delay needed to reach the lower fail, minus the delay needed to reach the highest fail.

It follows that when a multi-phase reference clocked receiver is known in advance to have a normal (50%) duty cycle (or close to that, such as a 47-53% duty cycle), the third and fourth I/O sensor versions may be realized without the multiplexers that are used for mode selection; instead, just one of the clock phases may be used for the connectivity quality estimation and the eye width measurement. Similarly, the second I/O sensor version may be realized without the clock phase inverter and the multiplexer which follows it, such that the connectivity quality estimation and the eye width measurement are performed based on the original clock signal only.

Further provided herein is a method to calculate eye width jitter. This may include making a large number (e.g., 10,000 or more) of M1 or M2 measurements using the second, third, or fourth I/O sensor versions, and calculating a statistical measure of the distribution of measurements. An alternative method to calculate the eye width jitter is to spread these M1 or M2 measurements over multiple interconnect lanes (namely, when the pertinent I/O sensor is connected to reference clocked receivers of multiple different lanes), such that the calculated eye width jitter is representative of jitter occurring over all these lanes.

Generally, as to all versions of the I/O sensor, it will be appreciated that an I/O sensor may include the controller that was briefly described above. The controller may be configured, by suitable circuitry it comprises, to control the programmable delay line, namely—to gradually adjust the amount of delay introduced by the delay line, according to whatever delay increments (or 'steps') are built-in the delay line. This gradual adjustment may be in accordance with the aforementioned scan method.

The controller may be further configured to control any of the mentioned multiplexers, to effect the different measurement modes.

The controller may be further configured to receive the comparison result (pass' or 'fail,' expressed as 0 or 1) from the comparison circuit (e.g., the XOR gate), whether directly after each comparison is made or only after the value in the last flip-flop (e.g., FF3 in FIG. 7 and comparable flip-flops in other figures) changes from one value to another (e.g., from 'pass' to 'fail' or vice versa).

Further, the controller may be configured to estimate a quality of connectivity between the ICs that are connected over the interconnect lane, based on the comparison result and the amount of delay that caused that result; namely, if the comparison result transforms (inverts) from a previous 'pass' to a 'fail' responsive to a certain amount of delay introduced by the delay line, the controller may deduce that the quality of connectivity is related to that certain amount of delay. Generally, the longer the delay—the better the quality of connectivity, and vice versa. The quality estimation may constitute, for example, measurement of an eye pattern parameter of a signal received over the interconnect lane, such as an eye width and/or an eye height. To measure eye height, the controller may be further configured to control the variable $V_{REF}$, so as to gradually adjust $V_{REF}$ to different levels as necessary to obtain an eye height measurement.

The quality estimation by the controller may also take the form of more prolonged monitoring, during which a trend of 'fail' results at varying delay amounts (and of respective eye pattern parameters) is detected, and optionally acted upon. Whether the estimation is instantaneous or prolonged, the controller may perform or trigger one or more actions, as discussed above, when the quality of connectivity is insufficient (e.g., below a threshold, or when a degradation trend exceeds a certain slope).

The controller may be further configured to perform the aforementioned duty cycle distortion detection/measurement, as well as the aforementioned eye width jitter measurement.

The controller may be further configured to transmit the quality estimation (e.g., the measured eye pattern parameter) to a computing device in which the multi-IC module is installed, and from there, optionally, to computerized server over a communication network. The quality estimation may be further analyzed by the computing device or computerized server, and each may issue an indication to a user regarding the quality estimation and/or the results of its further analysis.

Further generally, as to all versions of the I/O sensor, an I/O sensor may include, if desired, one or more compensatory delay elements configured to compensate for the intrinsic delay of element(s) of the I/O sensor and/or of greater signal propagation distances required due to the location of the I/O sensor. The compensatory delay buffer and the phase shifter of FIG. 8 are examples of such compensatory delay elements, with the first delaying a clock signal and the second delaying a data signal. Further examples are given in FIG. 14, with respect to distances to the I/O sensor that require timing compensation. The importance of such compensatory delay elements in an I/O sensor may increase, generally, as the data rate of the monitored interconnect lane increases; at high data rates, the sampling of the data signal must be precisely timed, and any uncompensated delays associated with the I/O sensor (its elements and/or its location) may reduce the reliability of the quality estimation, for example by producing an inaccurate measurement of the eye pattern parameter.

Advantages of the disclosed I/O sensors and I/O sensing methods may include:
  Full data lane coverage.
  Full coverage for driver and receiver (comparator, level shifter) circuits.
  Negligible impact on area and power.
  Use during test and in-mission.
  Data analytics capabilities.

The disclosed I/O sensors and I/O sensing methods may be useful, for example, for characterizing IC designs prior to fabrication:
  Characterization of lane performance (eye width and jitter) under different PVT (process voltage temperature) ranges.
  Inter-lane skew and cross-talk characterization.
  Substrate design topology validation.

The disclosed I/O sensors and I/O sensing methods may also be useful, for example, after ICs have been fabricated:
  Outlier detection of assembled multi-IC modules.
  Spare lane activation (if such lanes are available).
  Yield monitoring and early alerting on yield declines.

The disclosed I/O sensors and I/O sensing methods may also be useful, for example, for monitoring the reliability of multi-IC modules operating in the field, whose die-to-die lanes may degrade over time. If an upcoming failure is detected, predictive maintenance may be performed, such as activation of spare lanes, module swap, etc.

Another option is to perform the I/O sensing at each IC before it is finally packaged with another IC, to avoid packaging together ICs with substantial performance differences, for example receivers with substantially different delays. To this end, an embodiment may include a testing device ("tester") configured to transmit data to an IC connected to the tester, wherein the IC includes the disclosed I/O sensor. Since the tester is assumed to be transmitting data perfectly and not to be the cause of any lane delays (not substantial ones, anyway), any delay can be attributed to the tested IC. By testing every fabricated IC this way, "fast" ICs (those with low lane delays) may be interconnected and packaged together, and the same for "slow" ICs. This prevents packaging together a fast IC with a slow IC, which will result in a die-to-die connection which is as slow as the slowest IC—the 'weakest link.'

The flowchart, circuit, and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In the description and claims, each of the terms "substantially," "essentially," and forms thereof, when describing a numerical value, means up to a 20% deviation (namely, ±20%) from that value. Similarly, when such a term describes a numerical range, it means up to a 20% broader range-10% over that explicit range and 10% below it).

In the description, any given numerical range should be considered to have specifically disclosed all the possible subranges as well as individual numerical values within that range, such that each such subrange and individual numerical value constitutes an embodiment of the invention. This applies regardless of the breadth of the range. For example, description of a range of integers from 1 to 6 should be considered to have specifically disclosed subranges such as from 1 to 3, from 1 to 4, from 1 to 5, from 2 to 4, from 2 to 6, from 3 to 6, etc., as well as individual numbers within that range, for example, 1, 4, and 6. Similarly, description of a range of fractions, for example from 0.6 to 1.1, should be considered to have specifically disclosed subranges such as from 0.6 to 0.9, from 0.7 to 1.1, from 0.9 to 1, from 0.8 to 0.9, from 0.6 to 1.1, from 1 to 1.1 etc., as well as individual numbers within that range, for example 0.7, 1, and 1.1.

The descriptions of the various embodiments of the present invention have been presented for purposes of illustration, but are not intended to be exhaustive or limited to the explicit descriptions. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the description and claims of the application, each of the words "comprise," "include," and "have," as well as forms thereof, are not necessarily limited to members in a list with which the words may be associated.

What is claimed is:
1. An integrated circuit (IC) comprising:
   a programmable delay line;
   a reference clocked receiver;
   a delayed clocked receiver having the following inputs:
     a data signal and a reference voltage that also serve as inputs to the reference clocked receiver, wherein the reference clocked receiver is configured to sample the data signal received from an interconnect lane between the IC and another IC, wherein the IC and the other IC are part of a multi-IC module, and a delayed clock signal received from the programmable delay line, wherein the delayed clock signal is a delayed version of a clock signal that clocks the reference clocked receiver;

a comparison circuit configured to compare a data signal output of the delayed clocked receiver and a data signal output of the reference clocked receiver; and a controller configured to:
gradually adjust an amount of delay introduced by the programmable delay line,
receive a result of the comparison from the comparison circuit, following each gradual adjustment of the delay, and
based on at least one of the results and on the amount of delay that caused it, estimate a quality of connectivity between the IC and the other IC over the interconnect lane.

2. The IC of claim 1, wherein:
the programmable delay line comprises a coarse delay line and a fine delay line that are serially connected;
each delay step of the coarse delay line is longer than each delay step of the fine delay line;
the length of each delay step of the coarse delay line is configured to bring a rising edge of the delayed clock signal in proximity to where the result of the comparison is likely to inverted from a 'pass' to a 'fail,' or vice versa; and
the length of each delay step of the fine delay line is configured to detect an exact point where the result of the comparison is likely to be inverted from a 'pass' to a 'fail,' or vice versa.

3. The IC of claim 1, wherein the estimation of the quality of connectivity comprises a calculation of an eye pattern parameter of the data signal that was received from the interconnect lane between the IC and the other IC.

4. The IC of claim 3, wherein the eye pattern parameter comprises an eye width, that is calculated based on a time distance between points of inversion of the comparison result at the left and right sides of a Unit Interval (UI) of the data signal that was received from the interconnect lane between the IC and the other IC.

5. The IC of claim 4, wherein the controller is configured to operate the programmable delay line to scan the eye in one direction, in order to detect the points of inversion of the comparison result.

6. The IC of claim 4, wherein the controller is configured to select between two eye scanning modes:
a first eye scanning mode in which a first side of the eye is scanned by increasing or decreasing the amount of delay introduced by the programmable delay line; and
a second eye scanning mode in which a second, opposing side of the eye is scanned by increasing or decreasing the amount of delay introduced by the programmable delay line.

7. The IC of claim 6, wherein the clock signal that clocks the reference clocked receiver is a multi-phase clock signal, and wherein:
in the first eye scanning mode, one of the phases of the multi-phase clock signal is subject to the increasing or the decreasing of the amount of delay introduced by the programmable delay line;
in the second eye scanning mode, a different one of the phases of the multi-phase clock signal is subject to the increasing or the decreasing of the amount of delay introduced by the programmable delay line; and
in both the first and the second eye scanning modes, the different one of the phases of the multi-phase clock signal is used to clock the reference clocked receiver.

8. The IC of claim 6, wherein:
the reference voltage is a variable reference voltage;
the eye pattern parameter further comprises an eye height; and
the controller is further configured to measure the eye height by gradually adjusting the variable reference voltage during each of the first and second eye scanning modes, thereby measuring the eye width at different voltage levels.

9. The IC of claim 6, wherein:
the clock signal that clocks the reference clocked receiver is a multi-phase clock signal; and
the controller is further configured to detect a duty cycle distortion of the multi-phase clock signal based on just one of the two eye scanning modes.

10. The IC of claim 4, wherein:
the clock signal that clocks the reference clocked receiver is a multi-phase clock signal that has an approximately 50% duty cycle; and
in the calculation of the eye width, the delayed clock signal received from the programmable delay line is only one phase of the multi-phase clock signal.

11. The IC of claim 1, further comprising a compensatory delay element configured to apply a fixed amount of delay to the clock signal, to compensate for an intrinsic delay of the programmable delay line.

12. The IC of claim 1, further comprising a compensatory delay element configured to apply a fixed amount of delay to the data signal, to compensate for an intrinsic delay of the programmable delay line.

13. The IC of claim 1, further comprising a compensatory delay element configured to apply a fixed amount of delay to the data signal or the clock signal, to compensate for a distance between the reference clocked receiver and the delayed clocked receiver.

* * * * *